United States Patent
Otsuji et al.

(10) Patent No.: US 12,362,167 B2
(45) Date of Patent: Jul. 15, 2025

(54) METHOD FOR PRODUCING LIQUID CONTAINING SUBLIMABLE SUBSTANCE, SUBSTRATE DRYING METHOD, AND SUBSTRATE PROCESSING APPARATUS

(71) Applicant: SCREEN Holdings Co., Ltd., Kyoto (JP)

(72) Inventors: Masayuki Otsuji, Kyoto (JP); Naozumi Fujiwara, Kyoto (JP); Yuta Sasaki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 831 days.

(21) Appl. No.: 17/612,589

(22) PCT Filed: Mar. 26, 2020

(86) PCT No.: PCT/JP2020/013569
§ 371 (c)(1),
(2) Date: Nov. 19, 2021

(87) PCT Pub. No.: WO2020/241022
PCT Pub. Date: Dec. 3, 2020

(65) Prior Publication Data
US 2022/0238327 A1  Jul. 28, 2022

(30) Foreign Application Priority Data
May 29, 2019 (JP) .................... 2019-100140

(51) Int. Cl.
*H01L 21/02* (2006.01)
*H01L 21/67* (2006.01)

(52) U.S. Cl.
CPC .. *H01L 21/02057* (2013.01); *H01L 21/67034* (2013.01)

(58) Field of Classification Search
None
See application file for complete search history.

(56) References Cited

U.S. PATENT DOCUMENTS

| | | |
|---|---|---|
| 2015/0155159 A1 | 6/2015 | Igarashi et al. |
| 2017/0278726 A1 | 9/2017 | Miya |

(Continued)

FOREIGN PATENT DOCUMENTS

| | | |
|---|---|---|
| CN | 109427624 A | 3/2019 |
| JP | 2015-050414 A | 3/2015 |

(Continued)

OTHER PUBLICATIONS

International Search Report mailed Jun. 16, 2020 in corresponding PCT International Application No. PCT/JP2020/013569.

(Continued)

*Primary Examiner* — Jason Lau
(74) *Attorney, Agent, or Firm* — OSTROLENK FABER LLP

(57) ABSTRACT

A sublimable substance is selected on the basis of whether the surface of a pattern is hydrophilic or hydrophobic. In cases where the surface of a pattern is hydrophilic, a solvent for hydrophilic cases is selected, said solvent having lower solubility in water than the selected sublimable substance; and in cases where the surface of a pattern is hydrophobic, a solvent for hydrophobic cases is selected, said solvent having lower solubility in oils than the selected sublimable substance. The selected sublimable substance is dissolved in the selected solvent.

5 Claims, 10 Drawing Sheets

(56) References Cited

U.S. PATENT DOCUMENTS

2019/0063833 A1  2/2019  Okutani et al.
2019/0390320 A1  12/2019  Sasaki et al.

FOREIGN PATENT DOCUMENTS

| JP | 2015-106645 A | 6/2015 |
| JP | 2015-142069 A | 8/2015 |
| JP | 2017-175049 A | 9/2017 |
| JP | 2018-139331 A | 9/2018 |
| JP | 2019-029491 A | 2/2019 |
| JP | 2020-004948 A | 1/2020 |

OTHER PUBLICATIONS

Written Opinion mailed Jun. 16, 2020 in corresponding PCT International Application No. PCT/JP2020/013569.

International Preliminary Report on Patentability (Chapter I) mailed Dec. 9, 2021 with a copy of Notification from the International Bureau (Form PCT/IB/326) in corresponding PCT International Application No. PCT/JP2020/013569 in Japanese.

English translation of the International Preliminary Report on Patentability (Chapter I) mailed Dec. 9, 2021 with a copy of Notification from the International Bureau (Form PCT/IB/338) in corresponding PCT'International Application No. PCT/JP2020/013569.

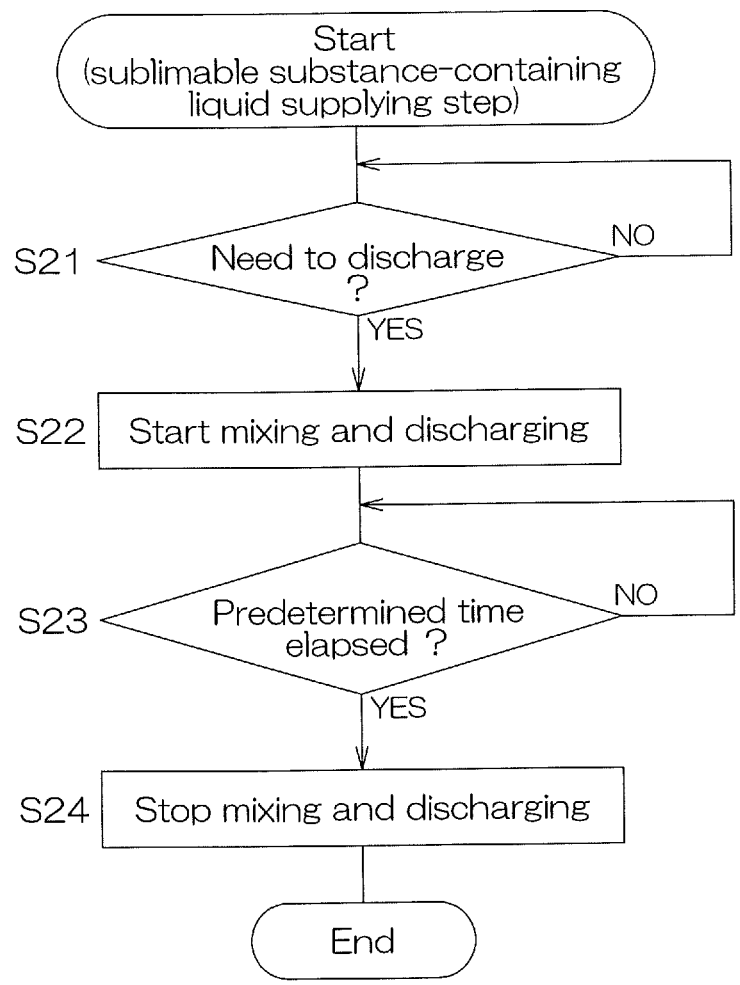

METHOD FOR PRODUCING LIQUID CONTAINING SUBLIMABLE SUBSTANCE, SUBSTRATE DRYING METHOD, AND SUBSTRATE PROCESSING APPARATUS

CROSS-REFERENCE TO RELATED APPLICATIONS

The present application is a 35 U.S.C. §§ 371 national phase conversion of International Application No. PCT/JP2020/013569, filed Mar. 26, 2020, which claims priority to Japanese Patent Application No. 2019-100140, filed May 29, 2019, the contents of both of which are incorporated herein by reference. The PCT International Application was published in the Japanese language.

TECHNICAL FIELD

This application claims the benefit of priority to Japanese Patent Application No. 2019-100140 filed on May 29, 2019, the entire contents of the application are hereby incorporated herein by reference.

The present invention relates to a method to manufacture a sublimable substance-containing liquid to be removed from a substrate when drying a front surface of the substrate on which a pattern is formed. The present invention further relates to a substrate drying method and a substrate processing apparatus to dry a substrate. The substrate includes, for example, a semiconductor wafer, a substrate for a FPD (flat panel display) such as a liquid crystal display and an organic EL (electroluminescence) display, a substrate for an optical disc, a substrate for a magnetic disk, a substrate for a magneto-optical disc, a substrate for a photomask, a ceramic substrate, a substrate for a solar cell, and the like.

BACKGROUND ART

In a manufacturing process for semiconductor devices or FPDs, required processes are conducted to a substrate such as a semiconductor wafer or a glass substrate for a FPD. Such processes include supplying a substrate with a processing liquid such as a chemical liquid or a rinse liquid. After the processing liquid is supplied, the processing liquid is removed from the substrate to dry the substrate.

In a case where a pattern is formed on a front surface of the substrate, when the substrate is being dried, a force due to the surface tension of the processing liquid adhering to the substrate applies to the pattern, so that the pattern may collapse. As countermeasures against this, a liquid having a lower surface tension such as IPA (isopropyl alcohol) is supplied to the substrate, or a hydrophobizing agent is supplied to the substrate in order to bring the contact angle of the liquid to the pattern closer to 90 degrees. However, a collapsing force to collapse the pattern does not become zero even when using IPA or the hydrophobizing agent, so that these countermeasures may not sufficiently prevent the collapse of the pattern depending on the strength of the pattern.

Recently, attention is focused on sublimation drying as a technique to prevent the collapse of the pattern. For example, Patent Literature 1 discloses a substrate drying method and a substrate processing apparatus to conduct the sublimation drying. Patent Literature 1 discloses dissolving an ammonium fluorosilicate as a sublimable substance (solute) in a pure water (DIW) or a mixed liquid of a DIW and an IPA (isopropyl alcohol), and dissolving a camphor or a naphthalene as the sublimable substance (solute) in an alcohol such as IPA.

Patent Literature 1 also discloses supplying a solution of the sublimable substance to the substrate after the pattern is formed on a SiN film, and supplying the solution of the sublimable substance to the substrate after the pattern is formed on a photoresist film. After the solution of the sublimable substance is supplied to the substrate, a film consisting of a solid sublimable substance is formed. After that, the substrate is transferred to a hot plate unit from a liquid processing unit. The substrate is heated by the hot plate unit at a temperature higher than a sublimation temperature of the sublimable substance. Thus, the sublimable substance sublimates and is removed from the substrate.

CITATION LIST

Patent Literature

Patent Literature 1: JP 2018-139331 A

SUMMARY OF INVENTION

Technical Problem

According to the research by the present inventors, it was found that it is also important to consider the affinity between the solvent and the pattern in order to reduce the collapse rate of pattern in the sublimation drying.

Specifically, when the affinity of the solvent with respect to the surface of the pattern is high, the solvent is likely to be held by the surface of the pattern. Thus, a lot of the solvent may remain between the patterns even after forming a solidified film including the sublimable substance. For example, when the surface of the pattern is hydrophilic and the hydrophilicity of the solvent is high, it is considered that a lot of the solvent remains between the patterns even after the solidified film is formed. In this case, it is considered that the solidified film is formed above the pattern while an area between the patterns is filled with a liquid containing the solvent (see FIG. 8B).

When the liquid containing the solvent remains between the patterns after forming the solidified film, a force due to the surface tension of the solvent is applied to the pattern. When the strength of the pattern is low, the pattern collapses even with such a force. Thus, the solvent is also required to have a low affinity with respect to the surface of the pattern. In Patent Literature 1, such a point is not taken into consideration at all. That is, the present inventors have found a new problem that the collapse rate of the pattern cannot be sufficiently reduced when the sublimable substance-containing liquid contains a solvent having an inappropriate affinity with respect to the pattern.

Thus, an object of the present invention is to provide a manufacturing method for a sublimable substance-containing liquid that is able to manufacture the sublimable substance-containing liquid containing a solvent having an appropriate affinity with respect to a pattern. Another object of the present invention is to provide a substrate drying method and a substrate processing apparatus that are able to dry a substrate using such a sublimable substance-containing liquid.

Solution to Problem

A preferred embodiment of the present invention provides a manufacturing method for a sublimable substance-containing liquid to be removed from a substrate when drying a front surface of the substrate on which a pattern is formed, the manufacturing method for the sublimable substance-containing liquid including a sublimable substance selecting step of selecting a sublimable substance based on whether a surface of the pattern is hydrophilic or hydrophobic, a solvent selecting step of selecting a solvent for hydrophilicity having less solubility in water than that of the sublimable substance selected in the sublimable substance selecting step in a case in which the surface of the pattern is hydrophilic and selecting a solvent for hydrophobicity having less solubility in oil than that of the sublimable substance selected in the sublimable substance selecting step in a case in which the surface of the pattern is hydrophobic, and a dissolving step of dissolving the sublimable substance selected in the sublimable substance selecting step in the solvent selected in the solvent selecting step.

In this method, the sublimable substance-containing liquid containing the sublimable substance and the solvent is manufactured. The sublimable substance-containing liquid is supplied to the front surface of the substrate on which the pattern is formed and then removed from the substrate. Thus, the substrate is dried. When removing the sublimable substance-containing liquid from the substrate, the solvent is evaporated from the sublimable substance-containing liquid on the front surface of the substrate, for example. Thus, the solidified film including the sublimable substance is formed on the front surface of the substrate. After that, the solidified film is sublimated and removed from the front surface of the substrate. Thus, the sublimable substance-containing liquid is removed.

In a case where the surface of the pattern is hydrophilic, the solvent having less solubility in water than that of the sublimable substance is contained in the sublimable substance-containing liquid. When the surface of the pattern is hydrophilic and the hydrophilicity of the solvent is high, the solvent is likely to be held on the surface of the pattern, so that a lot of the solvent remains between the patterns even after forming the solidified film. In this case, the collapsing force to collapse the pattern is applied to the pattern from the solvent. It is possible to reduce the solvent remaining between the patterns after forming the solidified film to zero or a value close to it by using the solvent having low hydrophilicity.

In a case where the surface of the pattern is hydrophobic, the solvent having less solubility in oil than that of the sublimable substance is contained in the sublimable substance-containing liquid. When the surface of the pattern is hydrophobic and the hydrophobicity of the solvent is high, the solvent is likely to be held on the surface of the pattern, so that a lot of the solvent remains between the patterns even after forming the solidified film. In this case, the collapsing force to collapse the pattern is applied to the pattern from the solvent. It is possible to reduce the solvent remaining between the patterns after forming the solidified film to zero or a value close to it by using the solvent having low hydrophobicity.

In this way, the solvent contained in the sublimable substance-containing liquid has less affinity with respect to the surface of the pattern than the sublimable substance contained in the sublimable substance-containing liquid regardless of whether the surface of the pattern is hydrophilic or hydrophobic. Thus, it is possible to reduce the solvent remaining between the patterns after forming the solidified film and to weaken the collapsing force applied to the pattern during and after the solidified film is formed. Accordingly, it is possible to manufacture the sublimable substance-containing liquid to dry the substrate with the low collapse rate of the pattern regardless of whether the surface of the pattern is hydrophilic or hydrophobic.

In the preferred embodiment, at least one of the following features may be added to the manufacturing method for the sublimable substance-containing liquid.

The manufacturing method for the sublimable substance-containing liquid further includes a property determining step of regarding the surface of the pattern as hydrophilic before selecting the sublimable substance and the solvent when a hydrophilic portion and a hydrophobic portion are included in the surface of the pattern and an upper end portion of a side surface of the pattern is hydrophilic and regarding the surface of the pattern as hydrophobic before selecting the sublimable substance and the solvent when the hydrophilic portion and the hydrophobic portion are included in the surface of the pattern and the upper end portion of the side surface of the pattern is hydrophobic.

In this method, in a case where the hydrophilic portion and the hydrophobic portion are included in the surface of the pattern, if the upper end portion of the side surface of the pattern is hydrophilic, the surface of the pattern is regarded as hydrophilic. In a case where the hydrophilic portion and the hydrophobic portion are included in the surface of the pattern, if the upper end portion of the side surface of the pattern is hydrophobic, the surface of the pattern is regarded as hydrophobic. That is, it is determined whether the surface of the pattern is hydrophilic or hydrophobic based on the property of the upper end portion of the side surface of the pattern.

When a liquid surface (interface between gas and liquid) is formed between two adjacent projecting patterns, the collapsing force due to the surface tension is applied to the patterns. This collapsing force increases as a distance from the root of the pattern to the liquid surface increases. Thus, even when the liquid surface is formed between the two adjacent projecting patterns, if the distance from the root (lower end) of the pattern to the liquid surface is short, the collapsing force applied to the pattern is weak.

If the surface of the pattern is regarded as hydrophobic when the hydrophilic portion and the hydrophobic portion are included in the surface of the pattern and the upper end portion of the side surface of the pattern is hydrophilic, it is likely that the liquid surface of the solvent is formed at the upper end portion of the side surface of the pattern after forming the solidified film and the large collapsing force is applied to the pattern. If the surface of the pattern is regarded as hydrophilic, even when the liquid surface of the solvent is formed between the patterns, the liquid surface of the solvent is disposed on the root side of the pattern. Thus, it is possible to shorten the distance from the root of the pattern to the liquid surface.

For the same reason, if the surface of the pattern is regarded as hydrophobic when the hydrophilic portion and the hydrophobic portion are included in the surface of the pattern and the upper end portion of the side surface of the pattern is hydrophobic, even when the liquid surface of the solvent is formed between the patterns, it is possible to shorten the distance from the root of the pattern to the liquid surface. Thus, it is possible to manufacture the sublimable substance-containing liquid to weaken the collapsing force applied to the pattern and to lower the collapse rate of the pattern.

Another preferred embodiment of the present invention provides a substrate drying method including a sublimable substance-containing liquid supplying step of supplying a front surface of a substrate with a sublimable substance-containing liquid manufactured by the manufacturing method for the sublimable substance-containing liquid, a solidified film forming step of forming a solidified film including the sublimable substance onto the front surface of the substrate by evaporating the solvent from the sublimable substance-containing liquid on the front surface of the substrate, and a sublimating step of removing the solidified film from the front surface of the substrate by sublimating the solidified film.

In this method, the sublimable substance-containing liquid containing the sublimable substance, which corresponds to the solute, and the solvent is supplied to the front surface of the substrate on which the pattern is formed. After that, the solvent is evaporated from the sublimable substance-containing liquid. Thus, the solidified film including the sublimable substance is formed on the front surface of the substrate. After that, the solidified film on the substrate is changed to gas without passing through to a liquid. Thus, the solidified film is removed from the front surface of the substrate. Accordingly, it is possible to lower the collapse rate of the patterns as compared to the conventional drying method such as spin drying.

Still another preferred embodiment of the present invention provides a substrate processing method to dry a front surface of a substrate on which a pattern is formed, the substrate processing method including a sublimable substance selecting step of selecting a sublimable substance based on whether a surface of the pattern is hydrophilic or hydrophobic, a solvent selecting step of selecting a solvent for hydrophilicity having less solubility in water than that of the sublimable substance selected in the sublimable substance selecting step in a case in which the surface of the pattern is hydrophilic and selecting a solvent for hydrophobicity having less solubility in oil than that of the sublimable substance selected in the sublimable substance selecting step in a case in which the surface of the pattern is hydrophobic, a dissolving step of manufacturing a sublimable substance-containing liquid containing the sublimable substance and the solvent by dissolving the sublimable substance selected in the sublimable substance selecting step in the solvent selected in the solvent selecting step, a sublimable substance-containing liquid supplying of supplying the sublimable substance-containing liquid manufactured in the dissolving step to the front surface of the substrate, a solidified film forming step of forming a solidified film including the sublimable substance onto the front surface of the substrate by evaporating the solvent from the sublimable substance-containing liquid on the front surface of the substrate, and a sublimating step of removing the solidified film from the front surface of the substrate by sublimating the solidified film.

In this method, the sublimable substance-containing liquid containing the sublimable substance, which corresponds to the solute, and the solvent is manufactured and the manufactured sublimable substance-containing liquid is supplied to the front surface of the substrate on which the pattern. After that, the solvent is evaporated from the sublimable substance-containing liquid. Thus, the solidified film including the sublimable substance is formed on the front surface of the substrate. After that, the solidified film on the substrate is changed to gas without passing through to a liquid. Thus, the solidified film is removed from the front surface of the substrate. Thus, it is possible to lower the collapse rate of the pattern as compared to the conventional drying method such as spin drying.

In a case where the surface of the pattern is hydrophilic, the solvent having less solubility in water than that of the sublimable substance is contained in the sublimable substance-containing liquid. When the surface of the pattern is hydrophilic and the hydrophilicity of the solvent is high, the solvent is likely to be held on the surface of the pattern, so that a lot of the solvent remains between the patterns even after forming the solidified film. In this case, the collapsing force to collapse the pattern is applied to the pattern from the solvent. It is possible to reduce the solvent remaining between the patterns after forming the solidified film to zero or a value close to it by using the solvent having low hydrophilicity.

In a case where the surface of the pattern is hydrophobic, the solvent having less solubility in oil than that of the sublimable substance is contained in the sublimable substance-containing liquid. When the surface of the pattern is hydrophobic and the hydrophobicity of the solvent is high, the solvent is likely to be held on the surface of the pattern, so that a lot of the solvent remains between the patterns even after forming the solidified film. In this case, the collapsing force to collapse the pattern is applied to the pattern from the solvent. It is possible to reduce the solvent remaining between the patterns after forming the solidified film to zero or a value close to it by using the solvent having low hydrophobicity.

In this way, the solvent contained in the sublimable substance-containing liquid has less affinity with respect to the surface of the pattern than the sublimable substance contained in the sublimable substance-containing liquid regardless of whether the surface of the pattern is hydrophilic or hydrophobic. Thus, it is possible to reduce the solvent remaining between the patterns after forming the solidified film and to weaken the collapsing force applied to the pattern during and after the solidified film is formed. Accordingly, it is possible to dry the substrate with the low collapse rate of the pattern regardless of whether the surface of the pattern is hydrophilic or hydrophobic.

In the preferred embodiment, at least one of the following features may be added to the substrate drying method.

The substrate drying method further includes a property determining step of regarding the surface of the pattern as hydrophilic before selecting the sublimable substance and the solvent when a hydrophilic portion and a hydrophobic portion are included in the surface of the pattern and an upper end portion of a side surface of the pattern is hydrophilic and regarding the surface of the pattern as hydrophobic before selecting the sublimable substance and the solvent when the hydrophilic portion and the hydrophobic portion are included in the surface of the pattern and the upper end portion of the side surface of the pattern is hydrophobic.

In this method, in a case where the hydrophilic portion and the hydrophobic portion are included in the surface of the pattern, if the upper end portion of the side surface of the pattern is hydrophilic, the surface of the pattern is regarded as hydrophilic. In a case where the hydrophilic portion and the hydrophobic portion are included in the surface of the pattern, if the upper end portion of the side surface of the pattern is hydrophobic, the surface of the pattern is regarded as hydrophobic. That is, it is determined whether the surface of the pattern is hydrophilic or hydrophobic based on the property of the upper end portion of the side surface of the pattern.

When a liquid surface (interface between gas and liquid) is formed between two adjacent projecting patterns, the collapsing force due to the surface tension is applied to the patterns. This collapsing force increases as a distance from the root of the pattern to the liquid surface increases. Thus, even when the liquid surface is formed between the two adjacent projecting patterns, if the distance from the root (lower end) of the pattern to the liquid surface is short, the collapsing force applied to the pattern is weak.

If the surface of the pattern is regarded as hydrophobic when the hydrophilic portion and the hydrophobic portion are included in the surface of the pattern and the upper end portion of the side surface of the pattern is hydrophilic, it is likely that the liquid surface of the solvent is formed at the upper end portion of the side surface of the pattern after forming the solidified film and the large collapsing force is applied to the pattern. If the surface of the pattern is regarded as hydrophilic, even when the liquid surface of the solvent is formed between the patterns, the liquid surface of the solvent is disposed on the root side of the pattern. Thus, it is possible to shorten the distance from the root of the pattern to the liquid surface.

For the same reason, if the surface of the pattern is regarded as hydrophobic when the hydrophilic portion and the hydrophobic portion are included in the surface of the pattern and the upper end portion of the side surface of the pattern is hydrophobic, even when the liquid surface of the solvent is formed between the patterns, it is possible to shorten the distance from the root of the pattern to the liquid surface. Thus, it is possible to weaken the collapsing force applied to the pattern and to lower the collapse rate of the pattern.

Still another preferred embodiment of the present invention provides a substrate processing apparatus to dry a front surface of a substrate on which a pattern is formed, the substrate processing apparatus including a sublimable substance selecting unit that selects a sublimable substance based on whether a surface of the pattern is hydrophilic or hydrophobic, a solvent selecting unit that selects a solvent for hydrophilicity having less solubility in water than that of the sublimable substance selected by the sublimable substance selecting unit in a case in which the surface of the pattern is hydrophilic and selects a solvent for hydrophobicity having less solubility in oil than that of the sublimable substance selected by the sublimable substance selecting unit in a case in which the surface of the pattern is hydrophobic, a dissolving unit that manufactures a sublimable substance-containing liquid containing the sublimable substance and the solvent by dissolving the sublimable substance selected by the sublimable substance selecting unit in the solvent selected by the solvent selecting unit, a sublimable substance-containing liquid supplying unit that supplies the sublimable substance-containing liquid manufactured by the dissolving unit to the front surface of the substrate, a solidified film forming unit that forms a solidified film including the sublimable substance onto the front surface of the substrate by evaporating the solvent from the sublimable substance-containing liquid on the front surface of the substrate, and a sublimating unit that removes the solidified film from the front surface of the substrate by sublimating the solidified film. According to this arrangement, the same effects as those of the substrate drying method described above can be obtained.

Whether the surface of the pattern is hydrophilic or hydrophobic may be determined based on the property of the surface of the pattern (hydrophilicity or hydrophobicity) when the sublimable substance-containing liquid first comes into contact with the front surface of the substrate. For example, when a chemical liquid is supplied to the front surface of the substrate before supplying the sublimable substance-containing liquid, the surface of the pattern may change from one of hydrophilicity and hydrophobicity to the other of hydrophilicity and hydrophobicity. In such a case, the sublimable substance and the solvent may be selected based on the surface property of the pattern after supplying the chemical liquid.

In a case where the selected sublimable substance is insoluble or difficult to dissolve in the selected solvent, the dissolving step may include an amphiphilic molecule adding step of dissolving the selected sublimable substance in the selected solvent by mixing the selected sublimable substance, the selected solvent, and an amphiphilic molecule including both of a hydrophilic group and a hydrophobic group. The dissolving unit may include an amphiphilic molecule adding unit that dissolves the selected sublimable substance in the selected solvent by mixing the selected sublimable substance, the selected solvent, and an amphiphilic molecule including both of a hydrophilic group and a hydrophobic group. In these cases, the solvent dissolves in the amphiphilic molecule and the sublimable substance dissolves in the mixed liquid of the solvent and the amphiphilic molecule. Thus, even if the sublimable substance is insoluble or difficult to dissolve in the solvent, it is possible to manufacture the sublimable substance-containing liquid containing the sublimable substance and the solvent.

The sublimable substance selecting step may be a step of selecting the sublimable substance including a hydrophilic group in a case where the surface of the pattern is hydrophilic and selecting the sublimable substance including a hydrophobic group in a case where the surface of the pattern is hydrophobic. The sublimable substance selecting unit may be a unit that selects the sublimable substance including a hydrophilic group in a case where the surface of the pattern is hydrophilic and selects the sublimable substance including a hydrophobic group in a case where the surface of the pattern is hydrophobic. In these cases, it is possible to manufacture the sublimable substance-containing liquid containing the sublimable substance having high affinity with respect to the surface of the pattern. Thus, it is possible to further reduce the solvent remaining between the patterns after forming the solidified film.

The above and other objects, features, and advantages of the present invention will become more apparent from the following detailed description of the preferred embodiments with reference to the attached drawings.

BRIEF DESCRIPTION OF THE DRAWINGS

FIG. 10 is a process chart for describing another example of the sublimable substance-containing liquid supplying step shown in FIG. 6.

DETAILED DESCRIPTION OF PREFERRED EMBODIMENTS

In the description below, unless otherwise specified, it is to be understood that the atmospheric pressure inside a substrate processing apparatus 1 is kept at atmospheric pressure inside a clean room in which the substrate processing apparatus 1 is installed (e.g., one atmospheric pressure or a value in its vicinity).

Figure 1A:
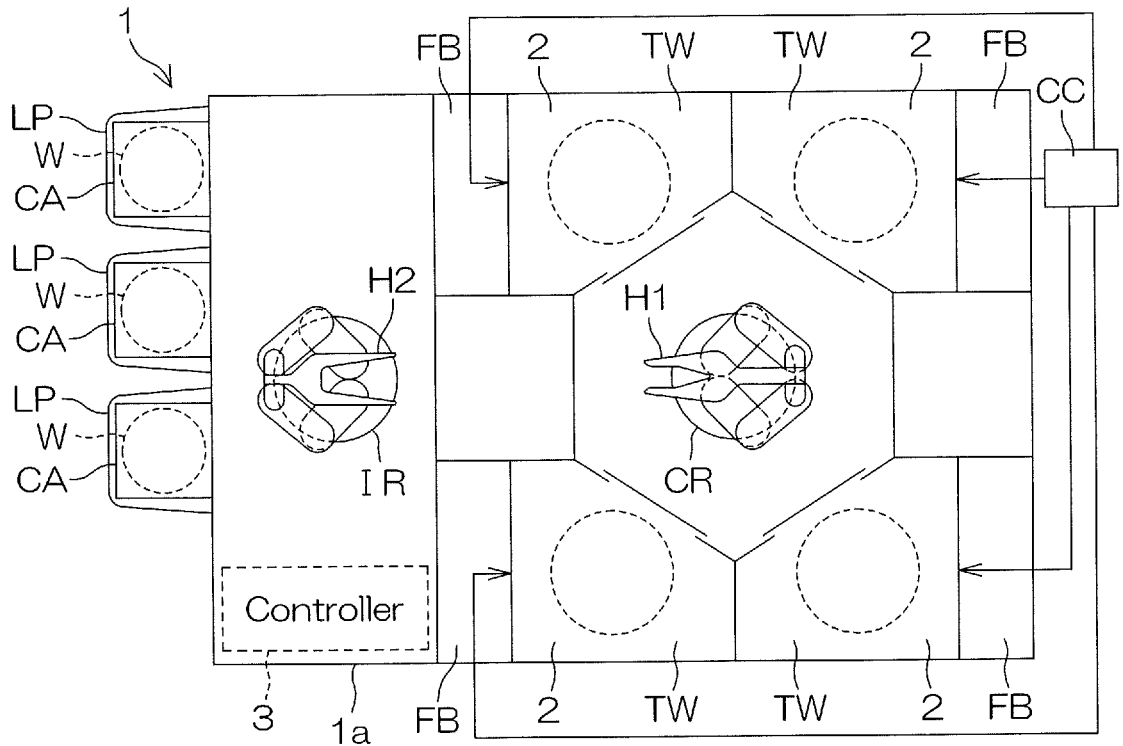
FIG. 1A is a schematic view of a substrate processing apparatus according to a first preferred embodiment of the present invention when viewed from above.
Figure 1B:
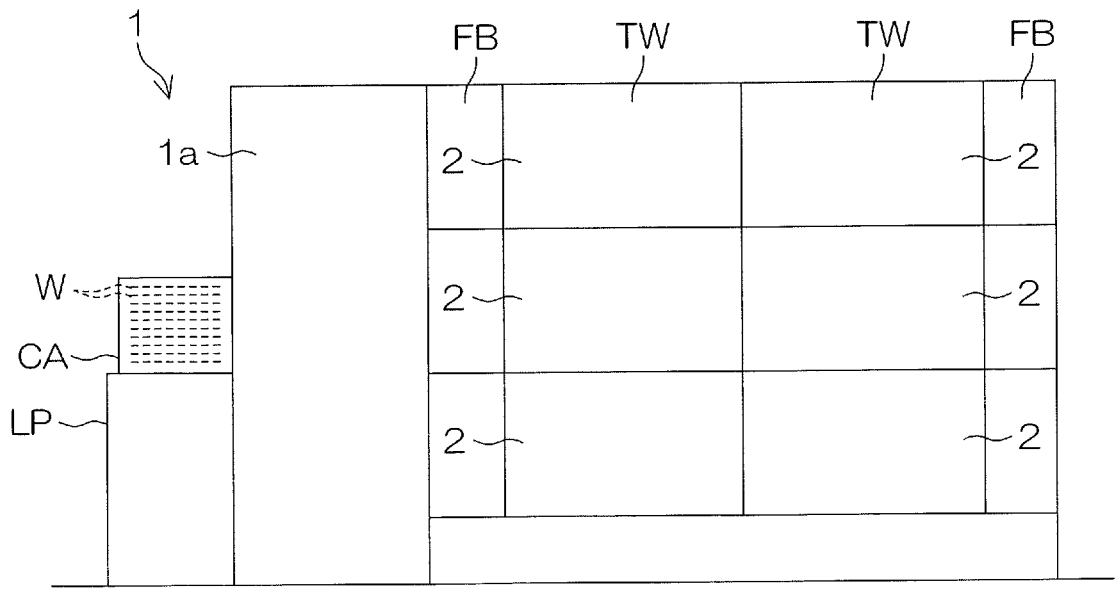
FIG. 1B is a schematic view of the substrate processing apparatus when viewed from the side.

FIG. 1A is a schematic view of a substrate processing apparatus 1 according to a first preferred embodiment of the present invention when viewed from above. FIG. 1B is a schematic view of the substrate processing apparatus 1 when viewed from the side.

As shown in FIG. 1A, the substrate processing apparatus 1 is a single substrate processing-type apparatus that processes disc-shaped substrates W such as a semiconductor wafer one by one. The substrate processing apparatus 1 includes load ports LP that hold carriers CA that house one or more substrates W, a plurality of processing units 2 that process the substrates W transferred from the carriers CA on the load ports LP with a processing fluid such as a processing liquid or a processing gas, transfer robots that transfer the substrates W between the carriers CA on the load ports LP and the processing units 2 and a controller 3 that controls the substrate processing apparatus 1.

The transfer robots include an indexer robot IR that carries the substrates W into and out from the carriers CA on the load ports LP and a center robot CR that carries the substrates W into and out from the processing units 2. The indexer robot IR transfers the substrates W between the load ports LP and the center robot CR, the center robot CR transfers the substrates W between the indexer robot IR and the processing units 2. The center robot CR includes hands H1 that support the substrates W and the indexer robot IR includes hands H2 that support the substrates W.

The plurality of processing units 2 form a plurality of towers TW disposed around the center robot CR in a plan view. FIG. 1A shows an example in which four towers TW are formed. The center robot CR is able to access each of the towers TW. As shown in FIG. 1B, each of the towers TW includes the plurality of (for example, three) processing units 2 that are stacked vertically.

As shown in FIG. 1A, the substrate processing apparatus 1 includes a plurality of (for example, four) fluid boxes 4 that house fluid devices such as valve. The four fluid boxes 4 correspond to the four towers TW, respectively. Liquid in a cabinet CC is supplied through any of the fluid boxes FB to all the processing units 2 included in the tower TW corresponding to this fluid box FB. The cabinet CC of the substrate processing apparatus 1 may be disposed around an outer wall 1a of the substrate processing apparatus 1 or may be disposed in the basement of a clean room in which the substrate processing apparatus 1 is installed.

Figure 2:
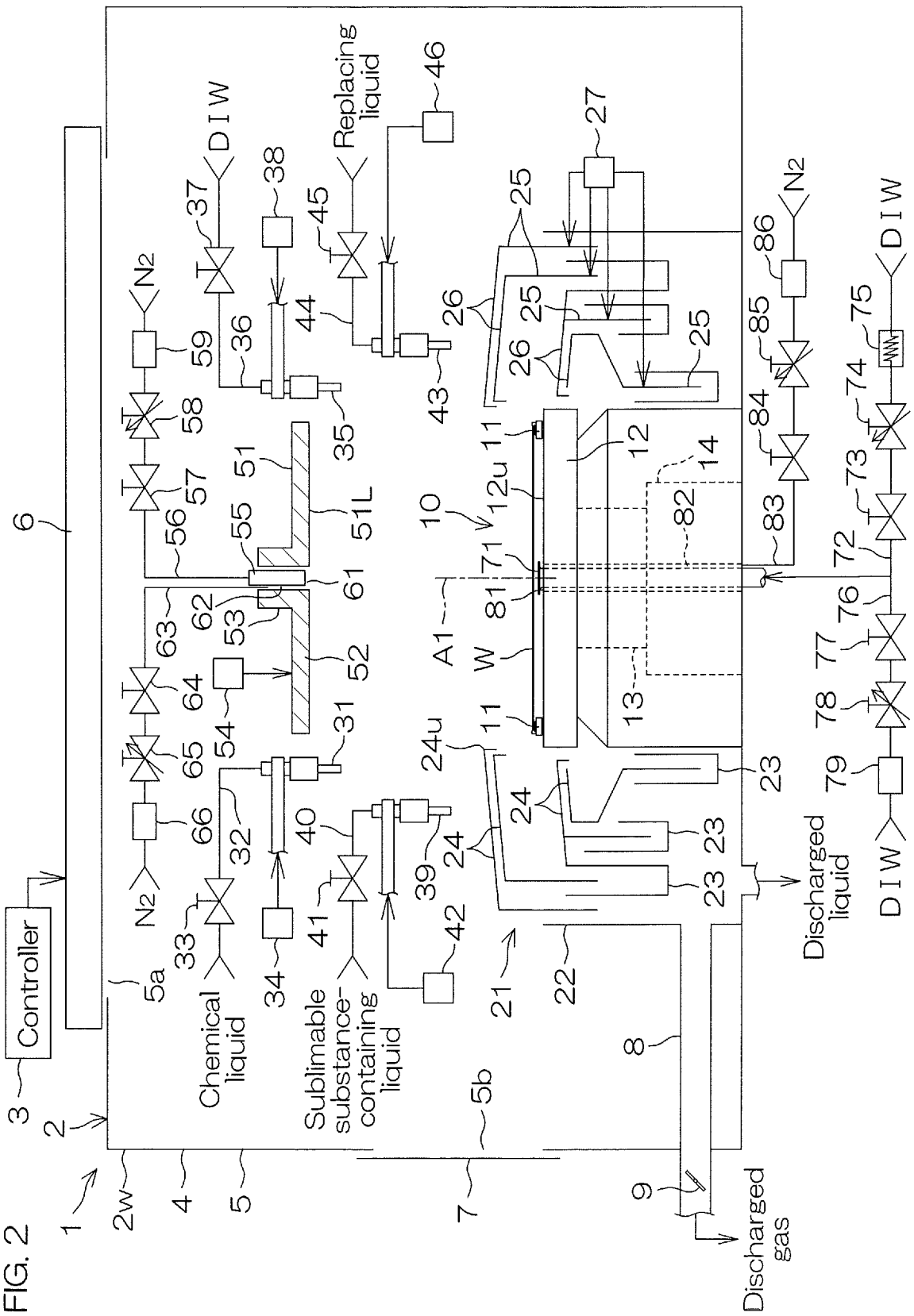
FIG. 2 is a schematic view of the inside of a processing unit, when viewed horizontally, which is provided in the substrate processing apparatus.

FIG. 2 is a schematic view of the inside of a processing unit 2, when viewed horizontally, which is provided in the substrate processing apparatus 1.

The processing unit 2 is a wet-processing unit 2W that provides the processing liquid to the substrate W. The processing unit 2 includes a box-shaped chamber 4 that has an internal space, a spin chuck 10 that rotates one substrate W around a vertical rotation axis A1 passing through the central portion of the substrate W while holding the substrate W horizontally within the chamber 4 and a tubular processing cup 21 that surrounds the spin chuck 10 around the rotation axis A1.

The chamber 4 includes a box-shaped partition wall 5 provided with a carry-in/carry-out port 5b through which the substrate W passes, and a shutter 7 to open and close the carry-in/carry-out port 5b. An FFU 6 (fan filter unit) is disposed on an air outlet 5a that is provided in the upper portion of the partition wall 5. The FFU 6 supplies clean air (filtered air) all the time through the air outlet 5a into the chamber 4. A gas inside the chamber 4 is discharged from the chamber 4 through an exhaust duct 8 that is connected to the bottom portion of the processing cup 21. Thus, the downflow of clean air is formed inside the chamber 4 all the time. The flow rate of the discharged gas that is discharged into the exhaust duct 8 changes depending on the opening degree of an exhaust valve 9 that is disposed inside the exhaust duct 8.

The spin chuck 10 includes a disc-shaped spin base 12 that is held in a horizontal posture, a plurality of chuck pins 11 that hold the substrate W in the horizontal posture above the spin base 12, a spin shaft 13 that extends downward from the central portion of the spin base 12 and a spin motor 14 that rotates the spin base 12 and the chuck pins 11 by rotating the spin shaft 13. The spin chuck 10 is not limited to a clamping type chuck that brings the chuck pins 11 into contact with the outer circumferential surface of the substrate W, and the spin chuck 10 may be a vacuum-type chuck that sucks the rear surface (lower surface) of the substrate W that is a non-device formation surface to the upper surface 12u of the spin base 12 so as to hold the substrate W horizontally.

The processing cup 21 includes a plurality of guards 24 to receive a processing liquid discharged outwardly from the substrate W, a plurality of cups 23 to receive the processing liquid guided downwardly by the plurality of guards 24, and a cylindrical outer wall member 22 that surrounds the plurality of guards 24 and the plurality of cups 23. FIG. 2 shows an example in which four guards 24 and three cups 23 are provided, and the outermost cup 23 is integral with the guard 24 that is the third from the top.

The guard 24 includes a cylindrical portion 25 that surrounds the spin chuck 10, and an annular ceiling portion 26 that extends diagonally upwardly toward the rotation axis A1 from the upper end portion of the cylindrical portion 25. The plurality of ceiling portions 26 are stacked in the vertical direction, and the plurality of cylindrical portions 25 are disposed concentrically. The annular upper end of the ceiling portions 26 corresponds to the upper end 24u of the guards 24 that surround the substrate W and the spin base 12 in a plan view. The plurality of cups 23 are disposed below the plurality of cylindrical portions 25, respectively. The cup 23 defines an annular liquid-receiving groove that receives a processing liquid guided downwardly by the guard 24.

The processing unit 2 includes a guard elevating/lowering unit 27 to individually elevate and lower the plurality of guards 24. The guard elevating/lowering unit 27 locates the guards 24 at an arbitrary position within a range from an upper position to a lower position. FIG. 2 shows a state in which two guards 24 are disposed at an upper position, and the remaining two guards 24 are disposed at a lower position. The upper position is a position in which the upper end 24u of the guards 24 is disposed higher than a holding position in which the substrate W held by the spin chuck 10 is disposed. The lower position is a position in which the upper end 24u of the guards 24 is disposed lower than the holding position.

A processing liquid is supplied to the rotating substrate W in a state in which at least one guard 24 is disposed at the upper position. When the processing liquid is supplied to the substrate W in the state, the processing liquid flies off outward from the substrate W. The flied-off processing liquid collides with the inner surface of the guard 24 horizontally opposing the substrate W, and is then guided with the cup 23 that is associated with the guard 24. This allows the processing liquid discharged from the substrate W to be collected in the cup 23.

The processing unit 2 includes a plurality of nozzles to discharge the processing liquid to the substrate W held by the spin chuck 10. The plurality of nozzles include a chemical liquid nozzle 31 to discharge a chemical liquid to the upper surface of the substrate W, a rinse liquid nozzle 35 to discharge a rinse liquid to the upper surface of the substrate W, a sublimable substance-containing liquid nozzle 39 to discharge a sublimable substance-containing liquid to the upper surface of the substrate W, and a replacing liquid nozzle 43 to discharge a replacing liquid to the upper surface of the substrate W.

The chemical liquid nozzle 31 may be a scan nozzle that is horizontally movable within the chamber 4 or alternatively, may be a fixed nozzle that is secured with respect to the partition wall 5 of the chamber 4. The same applies to the rinse liquid nozzle 35, the sublimable substance-containing liquid nozzle 39, and the replacing liquid nozzle 43. FIG. 2 shows an example in which each of the chemical liquid nozzle 31, the rinse liquid nozzle 35, the sublimable substance-containing liquid nozzle 39, and the replacing liquid nozzle 43 is a scan nozzle, and four nozzle moving units associated with those four nozzles respectively are provided.

The chemical liquid nozzle 31 is connected to a chemical liquid piping 32 that guides a chemical liquid to the chemical liquid nozzle 31. When a chemical liquid valve 33 interposed in the chemical liquid piping 32 is opened, the chemical liquid is continuously discharged downwardly from the discharge port of the chemical liquid nozzle 31. The chemical liquid to be discharged from the chemical liquid nozzle 31 may be a liquid that contains at least one of sulfuric acid, nitric acid, hydrochloric acid, hydrofluoric acid, phosphorus acid, acetic acid, ammonia water, a hydrogen peroxide solution, organic acid (e.g., such as citric acid or oxalic acid), organic alkaline (e.g., TMAH: tetramethyl ammonium hydroxide), a surface-active agent, and a corrosion inhibitor, or alternatively, may be a solution other than those.

Although not shown, the chemical liquid valve 33 includes a valve body provided with an annular valve seat through which the chemical liquid passes, a valve member which is movable with respect to the valve seat and an actuator which moves the valve member between a closed position where the valve member is in contact with the valve seat and an open position where the valve member is separated from the valve seat. The same applies to other valves. The actuator may be a pneumatic actuator or an electric actuator or an actuator other than those. The controller 3 opens and closes the chemical liquid valve 33 by controlling the actuator.

The chemical liquid nozzle 31 is connected to a nozzle moving unit 34 that moves the chemical liquid nozzle 31 at least in one of the vertical and horizontal directions. The nozzle moving unit 34 horizontally moves the chemical liquid nozzle 31 between a processing position at which the chemical liquid discharged from the chemical liquid nozzle 31 is supplied to the upper surface of the substrate W and a standby position at which the chemical liquid nozzle 31 is positioned around the processing cup 21 in a plan view.

The rinse liquid nozzle 35 is connected to a rinse liquid piping 36 that guides a rinse liquid to the rinse liquid nozzle 35. When a rinse liquid valve 37 interposed in the rinse liquid piping 36 is opened, the rinse liquid is continuously discharged downwardly from the discharge port of the rinse liquid nozzle 35. For example, the rinse liquid discharged from the rinse liquid nozzle 35 is pure water (DIW (Deionized Water)). The rinse liquid may be any one of carbonated water, electrolyzed ion water, hydrogen water, ozone water, and hydrochloric acid water of a diluted concentration (e.g., approximately 10 to 100 ppm).

The rinse liquid nozzle 35 is connected to a nozzle moving unit 38 that moves the rinse liquid nozzle 35 at least in one of the vertical and horizontal directions. The nozzle moving unit 38 horizontally moves the rinse liquid nozzle 35 between the processing position, at which the rinse liquid discharged from the rinse liquid nozzle 35 is supplied to the upper surface of the substrate W, and the standby position at which the rinse liquid nozzle 35 is located around the processing cup 21 in a plan view.

The sublimable substance-containing liquid nozzle 39 is connected to a sublimable substance-containing liquid piping 40 that guides the processing liquid to the sublimable substance-containing liquid nozzle 39. When a sublimable substance-containing liquid valve 41 interposed in the sublimable substance-containing liquid piping 40 is opened, the sublimable substance-containing liquid is continuously discharged downwardly from the discharge port of the sublimable substance-containing liquid nozzle 39. Similarly, the replacing liquid nozzle 43 is connected to a replacing liquid piping 44 that guides a replacing liquid to the replacing liquid nozzle 43. When a replacing liquid valve 45 interposed in the replacing liquid piping 44 is opened, the replacing liquid is continuously discharged downwardly from the discharge port of the replacing liquid nozzle 43.

The sublimable substance-containing liquid is a solution that contains a sublimable substance corresponding to a solute, and a solvent in which the sublimable substance dissolves. The sublimable substance-containing liquid may further contain a substance other than the sublimable substance and the solvent. The sublimable substance may be a substance that changes from solid to gas without passing through to a liquid at normal temperature (the same as the room temperature) or at normal pressure (the pressure inside the substrate processing apparatus 1, e.g., at one atmospheric pressure or a value in its vicinity).

The freezing point of the sublimable substance-containing liquid (the freezing point at one atmospheric pressure; the same applies hereinafter) is lower than the room temperature (23° C. or a value in its vicinity). The substrate processing apparatus 1 is disposed inside a clean room that is maintained at the room temperature. Therefore, even without heating the sublimable substance-containing liquid, the sublimable substance-containing liquid can be maintained in the form of liquid. The freezing point of the sublimable substance is higher than the freezing point of the sublimable substance-containing liquid. The freezing point of the sublimable substance is higher than the room temperature. The sublimable substance is solid at the room temperature. The freezing point of the sublimable substance may be higher than the boiling point of the solvent. The vapor pressure of the solvent is higher than the vapor pressure of the sublimable substance.

For example, the sublimable substance may be any one of alcohol (for example, 2-methyl-2-propanol (alias: tert-butyl alcohol, t-butyl alcohol, tertiary butyl alcohol) or cyclohexanol), a fluorinated hydrocarbon compound, 1,3,5-trioxane (alias: metaformaldehyde), camphor, naphthalene and iodine, or alternatively, may be a substance other than those.

For example, the solvent may be at least one type selected from the group consisting of pure water, IPA, methanol, HFE (hydrofluoroether), acetone, PGMEA (propylene glycol monomethyl ether acetate), PGEE (propylene glycol monoethyl ether, 1-ethoxy-2-propanol), and ethylene glycol. IPA has a higher vapor pressure than water and a lower surface tension than water.

As described below, the replacing liquid is supplied to the upper surface of the substrate W covered with the liquid film of the rinse liquid, and the sublimable substance-containing liquid is supplied to the upper surface of the substrate W covered with the liquid film of the replacing liquid. The replacing liquid may be any liquid as long as the replacing liquid dissolves in both the rinse liquid and the sublimable substance-containing liquid. The replacing liquid is IPA (liquid), for example. The replacing liquid may be a liquid mixture of IPA and HFE, or may be a liquid other than these.

When the replacing liquid is supplied to the upper surface of the substrate W covered with the liquid film of rinse liquid, most of the rinse liquid on the substrate W is washed away by the replacing liquid and thus discharged from the substrate W. The small amount of remaining rinse liquid is dissolved in the replacing liquid to be diffused into the replacing liquid. The diffused rinse liquid is discharged from the substrate W together with the replacing liquid. Therefore, the rinse liquid on the substrate W can be efficiently replaced with the replacing liquid. For the same reason, the replacing liquid on the substrate W can be efficiently replaced with the sublimable substance-containing liquid. This makes it possible to reduce the rinse liquid contained in the sublimable substance-containing liquid on the substrate W.

The sublimable substance-containing liquid nozzle 39 is connected to a nozzle moving unit 42 that moves the sublimable substance-containing liquid nozzle 39 at least in one of the vertical and horizontal directions. The nozzle moving unit 42 horizontally moves the sublimable substance-containing liquid nozzle 39 between the processing position, at which the sublimable substance-containing liquid discharged from the sublimable substance-containing liquid nozzle 39 is supplied to the upper surface of the substrate W, and the standby position at which the sublimable substance-containing liquid nozzle 39 is located around the processing cup 21 in a plan view.

Similarly, the replacing liquid nozzle 43 is connected to a nozzle moving unit 46 that moves the replacing liquid nozzle 43 at least in one of the vertical and horizontal directions. The nozzle moving unit 46 horizontally moves the replacing liquid nozzle 43 between the processing position, at which the replacing liquid discharged from the replacing liquid nozzle 43 is supplied to the upper surface of the substrate W, and the standby position at which the replacing liquid nozzle 43 is located around the processing cup 21 in a plan view.

The processing unit 2 includes a shielding member 51 that is disposed above the spin chuck 10. FIG. 2 shows an example in which the shielding member 51 is a disc-shaped shielding plate. The shielding member 51 includes a disc portion 52 that is horizontally disposed above the spin chuck 10. The shielding member 51 is horizontally supported by a tubular support shaft 53 that extends upwardly from the center portion of the disc portion 52. The center line of the disc portion 52 is disposed on the rotation axis A1 of the substrate W. The lower surface of the disc portion 52 corresponds to the lower surface 51L of the shielding member 51. The lower surface 51L of the shielding member 51 is an opposing surface that faces the upper surface of the substrate W. The lower surface 51L of shielding member 51 is parallel to the upper surface of the substrate W, and has an outer diameter that is greater than or equal to the diameter of the substrate W.

The shielding member 51 is connected to a shielding member elevating/lowering unit 54 that vertically elevates or lowers the shielding member 51. The shielding member elevating/lowering unit 54 locates the shielding member 51 at an arbitrary position within a range from the upper position (the position shown in FIG. 2) to the lower position. The lower position is the proximity position at which the shielding member 51 is located at a height in which the lower surface 51L of the shielding member 51 comes into proximity to the upper surface of the substrate W and a scan nozzle such as the chemical liquid nozzle 31 cannot enter between the substrate W and the shielding member 51. The upper position is the separate position at which the shielding member 51 retracts to a height in which the scan nozzle is able to enter between the shielding member 51 and the substrate W.

The plurality of nozzles include a central nozzle 55 that downwardly discharges a processing fluid such as a processing liquid or a processing gas through an upper central opening 61 that is opened at the center portion of the lower surface 51L of the shielding member 51. The central nozzle 55 extends vertically along the rotation axis A1. The central nozzle 55 is disposed inside a through-hole that vertically penetrates the center portion of the shielding member 51. The inner circumferential surface of the shielding member 51 surrounds the outer circumferential surface of the central nozzle 55 across an interval in the radial direction (in the direction orthogonal to the rotation axis A1). The central nozzle 55 is elevated or lowered together with the shielding member 51. The discharge port of the central nozzle 55 to discharge the processing fluid is disposed above the upper central opening 61 of the shielding member 51.

The central nozzle 55 is connected to an upper gas piping 56 that guides an inert gas to the central nozzle 55. The substrate processing apparatus 1 may include an upper thermoregulator 59 that heats or cools the inert gas to be discharged from the central nozzle 55. When an upper gas valve 57 interposed in the upper gas piping 56 is opened, the inert gas is continuously discharged downwardly from the discharge port of the central nozzle 55 at a flow rate corresponding to the opening degree of a flow rate adjusting valve 58 that changes the flow rate of the inert gas. The inert gas discharged from the central nozzle 55 is a nitrogen gas. The inert gas may be a gas other than the nitrogen gas such as a helium gas or an argon gas.

The inner circumferential surface of the shielding member 51 and the outer circumferential surface of the central nozzle 55 define a tubular upper gas flow passage 62 that extends vertically. The upper gas flow passage 62 is connected to an upper gas piping 63 that guides the inert gas to the upper central opening 61 of the shielding member 51. The substrate processing apparatus 1 may include an upper thermoregulator 66 that heats or cools the inert gas to be discharged from the upper central opening 61 of the shielding member 51. When an upper gas valve 64 interposed in the upper gas piping 63 is opened, the inert gas is continuously discharged downwardly from the upper central opening 61 of the shielding member 51 at a flow rate corresponding to the opening degree of a flow rate adjusting valve 65 that changes the flow rate of the inert gas. The inert gas discharged from the upper central opening 61 of the shielding member 51 is a nitrogen gas. The inert gas may be a gas other than the nitrogen gas such as a helium gas or an argon gas.

The plurality of nozzles include a lower-surface nozzle 71 that discharges the processing liquid to the center portion of the lower surface of the substrate W. The lower-surface nozzle 71 includes a nozzle disc portion that is disposed between the upper surface 12u of the spin base 12 and the lower surface of the substrate W, and a nozzle cylindrical portion that downwardly extends from the nozzle disc portion. The discharge port of the lower-surface nozzle 71 is opened at the center portion of the upper surface of the nozzle disc portion. When the substrate W is held on the spin chuck 10, the discharge port of the lower-surface nozzle 71 vertically faces the center portion of the lower surface of the substrate W.

The lower-surface nozzle 71 is connected to a heating fluid piping 72 that guides hot water (pure water at a temperature higher than the room temperature) serving as an example of heating fluid to the lower-surface nozzle 71. The pure water supplied to the lower-surface nozzle 71 is heated by a heater 75 that is interposed in the heating fluid piping 72. When a heating fluid valve 73 interposed in the heating fluid piping 72 is opened, the hot water is discharged continuously upwardly from the discharge port of the lower-surface nozzle 71 at a flow rate corresponding to the opening degree of a flow rate adjusting valve 74 that changes the flow rate of the hot water. This allows the hot water to be supplied to the lower surface of the substrate W.

Furthermore, the lower-surface nozzle 71 is connected to a cooling fluid piping 76 that guides cold water (pure water at a temperature lower than the room temperature) serving as an example of cooling fluid to the lower-surface nozzle 71. The pure water supplied to the lower-surface nozzle 71 is cooled by a cooler 79 interposed in the cooling fluid piping 76. When a cooling fluid valve 77 interposed in the cooling fluid piping 76 is opened, the cold water is continuously discharged upwardly from the discharge port of the lower-surface nozzle 71 at a flow rate associated with the opening degree of a flow rate adjusting valve 78 that changes the flow rate of the cold water. This allows the cold water to be supplied to the lower surface of the substrate W.

The outer circumferential surface of the lower-surface nozzle 71 and the inner circumferential surface of the spin base 12 define a tubular lower gas flow passage 82 that extends vertically. The lower gas flow passage 82 includes a lower central opening 81 that is opened at the center portion of the upper surface 12u of the spin base 12. The lower gas flow passage 82 is connected to a lower gas piping 83 that guides the inert gas to the lower central opening 81 of the spin base 12. The substrate processing apparatus 1 may include a lower thermoregulator 86 that heats or cools the inert gas to be discharged from the lower central opening 81 of the spin base 12. When a lower gas valve 84 interposed in the lower gas piping 83 is opened, the inert gas is continuously discharged upwardly from the lower central opening 81 of the spin base 12 at a flow rate corresponding to the opening degree of a flow rate adjusting valve 85 that changes the flow rate of the inert gas.

The inert gas discharged from the lower central opening 81 of the spin base 12 is a nitrogen gas. The inert gas may be a gas other than the nitrogen gas such as a helium gas or an argon gas. When the lower central opening 81 of the spin base 12 discharges the nitrogen gas with the substrate W held on the spin chuck 10, the nitrogen gas radially flows in all directions between the lower surface of the substrate W and the upper surface 12u of the spin base 12. This allows the space between the substrate W and the spin base 12 to be filled with the nitrogen gas.

Next, description will be made to a sublimable substance-containing liquid supplying unit 99.

Figure 3:
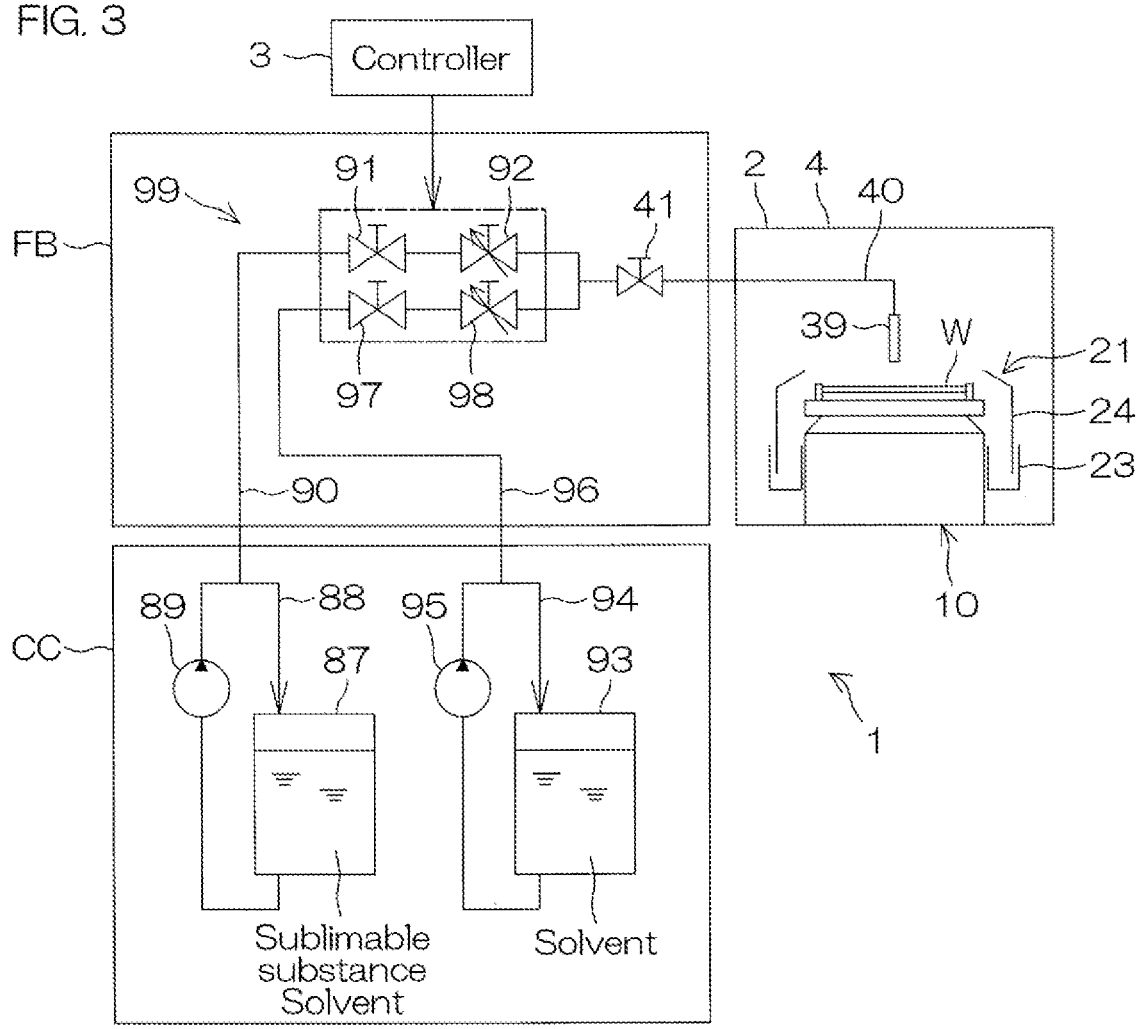
FIG. 3 is a schematic view showing a sublimable substance-containing liquid supplying unit provided in the substrate processing apparatus.
Figure 4A:
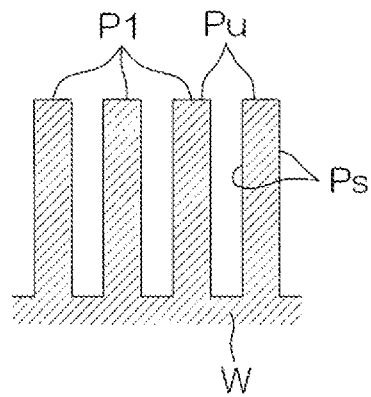
FIG. 4A and FIG. 4B are cross-sectional views showing examples of a cross-section of the substrate to be processed by the substrate processing apparatus.
Figure 4B:
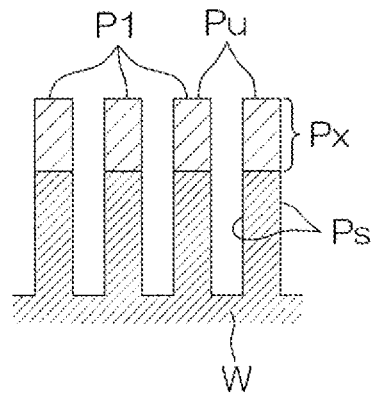

FIG. 3 is a schematic view showing a sublimable substance-containing liquid supplying unit 99 provided in the substrate processing apparatus 1. FIG. 4A and FIG. 4B are cross-sectional views showing examples of a cross-section of the substrate to be processed by the substrate W processing apparatus 1

As shown in FIG. 3, the substrate processing apparatus 1 includes the sublimable substance-containing liquid supplying unit 99 that supplies the sublimable substance-containing liquid to the substrate W held by the spin chuck 10. The sublimable substance-containing liquid nozzle 39, the sublimable substance-containing liquid piping 40, and the sublimable substance-containing liquid valve 41 described above are contained in the sublimable substance-containing liquid supplying unit 99.

The sublimable substance-containing liquid supplying unit 99 includes an undiluted liquid tank 87 that stores the sublimable substance-containing liquid corresponding to a undiluted liquid, a circulation piping 88 that circulates the sublimable substance-containing liquid in the undiluted liquid tank 87, a pump 89 that sends the sublimable substance-containing liquid in the undiluted liquid tank 87 to the circulation piping 88, and an individual piping 90 that guides the sublimable substance-containing liquid in the circulation piping 88 to the sublimable substance-containing liquid piping 40. The sublimable substance-containing liquid supplying unit 99 further includes an opening and closing valve 91 that opens and closes the interior of the individual piping 90 and a flow rate adjusting valve 92 that changes the flow rate of the sublimable substance-containing liquid to be supplied to the sublimable substance-containing liquid piping 40 from the individual piping 90.

The sublimable substance-containing liquid supplying unit 99 includes a diluting liquid tank 93 that stores a diluting liquid to dilute the sublimable substance-containing liquid. The diluting liquid is a solvent having the same name as that of the solvent contained in the sublimable substance-containing liquid in the undiluted liquid tank 87, for example. a diluting liquid supplying unit includes a circulation piping 94 that circulates the diluting liquid in the diluting liquid tank 93, a pump 95 that sends the diluting liquid in the diluting liquid tank 93 to the circulation piping 94, and an individual piping 96 that guides the diluting liquid in the circulation piping 94 to the sublimable substance-containing liquid piping 40. The diluting liquid supplying unit further includes an opening and closing valve 97 that opens and closes the interior of the individual piping 96 and a flow rate adjusting valve 98 that changes the flow rate of the diluting liquid to be supplied to the sublimable substance-containing liquid piping 40 from the individual piping 96.

When the opening and closing valve 91 is opened, the sublimable substance-containing liquid is supplied to the sublimable substance-containing liquid piping 40 at a flow rate corresponding to the opening degree of the flow rate adjusting valve 92. When the opening and closing valve 97 is opened, the diluting liquid is supplied to the sublimable substance-containing liquid piping 40 at a flow rate corresponding to the opening degree of the flow rate adjusting valve 98. When both of the opening and closing valve 91 and the opening and closing valve 97 are opened, the sublimable substance-containing liquid supplied from the undiluted liquid tank 87 is mixed with the diluting liquid supplied from the diluting liquid tank 93 at the inside of the sublimable substance-containing liquid piping 40 and diluted. Thus, the diluted sublimable substance-containing liquid is discharged from the sublimable substance-containing liquid nozzle 39.

The controller 3 sets the opening degrees of the opening and closing valve 91, the flow rate adjusting valve 92, the opening and closing valve 97, and the flow rate adjusting valve 98 based on a concentration of the sublimable substance-containing liquid (a concentration of the sublimable substance) specified in a recipe described below. For example, in a case where the concentration of the sublimable substance-containing liquid specified in the recipe matches the concentration of the sublimable substance-containing liquid in the undiluted liquid tank 87, the opening and closing valve 91 is opened and the opening and closing valve 97 is closed. In a case where the concentration of the sublimable substance-containing liquid specified in the recipe is lower than the concentration of the sublimable substance-containing liquid in the undiluted liquid tank 87, both of the opening and closing valve 91 and the opening and closing valve 97 are opened and the opening degrees of the flow rate adjusting valve 92 and the flow rate adjusting valve 98 are adjusted. Thus, the concentration of the sublimable substance-containing liquid to be discharged from the sublimable substance-containing liquid nozzle 39 is approached to the concentration of the sublimable substance-containing liquid specified in the recipe.

The sublimable substance-containing liquid is selected according to the substrate W to be processed by the substrate processing apparatus 1 and stored in the undiluted liquid tank 87 before the processing of the substrate W at the substrate processing apparatus 1 is started. In a case where a surface of a pattern P1 (refer to FIG. 4A and FIG. 4B) formed on a front surface of the substrate W is hydrophilic, a sublimable substance including a hydrophilic group and a solvent for hydrophilicity having less solubility in water than that of this sublimable substance are selected. In a case where the surface of a pattern P1 formed on a front surface of the substrate W is hydrophobic, a sublimable substance including a hydrophobic group and a solvent for hydrophobicity having less solubility in water than that of this sublimable substance are selected. After that, the selected sublimable substance is dissolved in the selected solvent. Thus, the sublimable substance-containing liquid containing the selected sublimable substance and solvent is manufactured. The dissolution of the sublimable substance in the solvent may be conducted in the undiluted liquid tank 87, or may be conducted in a tank different from the undiluted liquid tank 87.

The sublimable substance-containing liquid in the undiluted liquid tank 87 may contain two or more kinds of the sublimable substances, or may contain two or more kinds of the solvents. The sublimable substance-containing liquid in the undiluted liquid tank 87 may further contain a substance other than the sublimable substance and the solvent. For example, an amphiphilic molecule including both of a hydrophilic group and a hydrophobic group may be contained in the sublimable substance-containing liquid. In this case, the solvent does not have to be a substance including a hydrophilic group and a hydrophobic group in the molecule such as alcohol.

In a case where the surface of the pattern P1 is hydrophilic and two or more kinds of the sublimable substances are contained in the sublimable substance-containing liquid, at least one kind of the sublimable substance may contain a hydrophilic group. In this case, the solubility of the solvent in water may be smaller than the solubility of the sublimable substance including a hydrophilic group in water. In a case where the surface of the pattern P1 is hydrophilic and two or more kinds of the solvents are contained in the sublimable substance-containing liquid, the solubilities of all kinds of the solvents in water are preferably smaller than the solubility of the sublimable substance including a hydrophilic group in water.

In a case where the surface of the pattern P1 is hydrophobic and two or more kinds of the sublimable substances are contained in the sublimable substance-containing liquid, at least one kind of the sublimable substance may contain a hydrophobic group. In this case, the solubility of the solvent in oil may be smaller than the solubility of the sublimable substance including a hydrophobic group in oil. In a case where the surface of the pattern P1 is hydrophobic and two or more kinds of the solvents are contained in the sublimable substance-containing liquid, the solubilities of all kinds of the solvents in oil are preferably smaller than the solubility of the sublimable substance including a hydrophobic group in water.

In a case where the surface of the pattern P1 is hydrophilic, the sublimable substance-containing liquid may be a solution consisting of camphor, tertiary butyl alcohol, and IPA or a solution consisting of camphor, IPA, the first solute, the second solute, and the first solvent, or may be a solution other than these. The followings are specific examples of the first solute, the second solute, and the first solvent. In a case where the surface of the pattern P1 is hydrophobic, the sublimable substance-containing liquid may be a solution consisting of camphor and IPA or a solution consisting of camphor and methanol, or may be a solution other than these. Camphor is the sublimable substance including a methyl group, which is an example of the hydrophobic group, in its molecule. Tertiary butyl alcohol is the sublimable substance including a methyl group, which is an example of the hydrophobic group, and a hydroxy group, which is an example of the hydrophilic group, in its molecule.

Each of the first solute and the second solute is a single substance. The first solute and the second solute are substances different from each other. Each of the first solute and the second solute has at least one of an amino group, a hydroxy group and a carbonyl group.

Each of the first solute and the second solute is any of phthalic anhydride, caffeine, melamine, 1,4-benzoquinone, camphor, hexamethylenetetramine, 1,3,5-trimethylhexahydro-1,3,5-triazine, 1-adamantanol, 1,4-diazabicyclo[2.2.2]octane, borneol, (−)-borneol, (±)-isoborneol, 1,2-cyclohexanedione, 1,3-cyclohexanedione, 1,4-cyclohexanedione, 3-methyl-1,2-cyclopentanedione, (±)-camphorquinone, (−)-camphorquinone, (+)-camphorquinone, and 1-adamantanamine.

The first solvent does not have to include pure water, or may include pure water and one or more kinds of substances other than pure water. The first solvent may include organic solvent. The organic solvent may be a single substance, or may be two or more kinds of substances mixed with each other.

Examples of the organic solvent include alcohol such as methanol (MeOH), ethanol (EtOH), or isopropanol (IPA), alkane such as hexane, heptane, or octane, ether such as butyl ethyl ether, dibutyl ether, or tetrahydrofuran (THF), lactic acid ester such as methyl lactate, or ethyl lactate (EL), aromatic hydrocarbon such as benzene, toluene, or xylene, ketone such as acetone, methyl ethyl ketone, methyl isobutyl ketone, 2-heptanone, cyclopentanone, or cyclohexanone, amide such as N,N-dimethylacetamide, or N-methylpyrrolidone, lactone such as gamma-butyrolactone.

Other examples of the ether include ethylene glycol monoalkylether such as ethylene glycol monomethyl ether, or ethylene glycol monohexyl ether, ethylene glycol monoalkyl ether acetate such as ethylene glycol monomethyl ether acetate, or ethylene glycol monoethyl ether acetate, propylene glycol monoalkyl ether such as propylene glycol monomethyl ether (PGME), or propylene glycol monoethyl Ether (PGEE), propylene glycol monoalkyl ether acetate such as propylene glycol monomethyl ether acetate (PGMEA), or propylene glycol monoethyl ether acetate.

As shown in FIG. 4A, in a case where an entire surface of the pattern P1, that is, an entire upper surface Pu of the pattern P1 and an entire side surface Ps of the pattern P1 have the same properties, if any portion of the surface of the pattern P1 is hydrophilic, the surface of the pattern P1 is determined to be hydrophilic. In a case where the entire surface of the pattern P1 has the same properties, if any portion of the surface of the pattern P1 is hydrophobic, the surface of the pattern P1 is determined to be hydrophobic. In this case, if the contact angle of water with respect to the surface of the pattern P1 is, for example, 60 degrees or less, the surface of the pattern P1 is determined to be hydrophilic. In a case where the entire surface of the pattern P1 has the same properties, the pattern P1 may be either a monolayer film or a laminated film.

On the other side, as shown in FIG. 4B, when a hydrophilic portion and a hydrophobic portion are included in the surface of the pattern P1, and an upper end portion Px of the side surface Ps of the pattern P1 is hydrophilic, the surface of the pattern P1 is regarded as hydrophilic. When the hydrophilic portion and the hydrophobic portion are included in the surface of the pattern P1, and an upper end portion Px of the side surface Ps of the pattern P1 is hydrophobic, the surface of the pattern P1 is regarded as hydrophobic. That is, in a case where the hydrophilic portion and the hydrophobic portion are included in the surface of the pattern P1, it is determined whether the surface of the pattern P1 is hydrophilic or hydrophobic based on the property of the upper end portion Px of the side surface Ps of the pattern P1.

Figure 5:
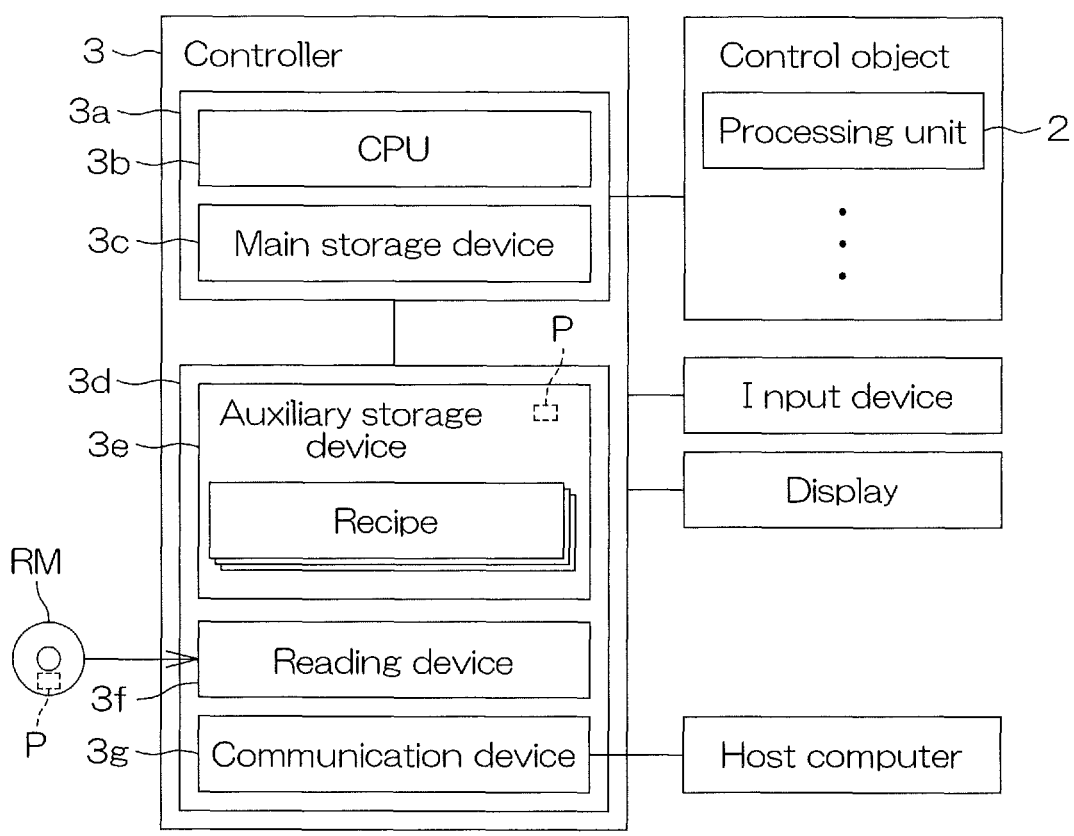
FIG. 5 is a block diagram showing a hardware of a controller.

FIG. 5 is a block diagram showing the hardware of the controller 3.

The controller 3 is a computer which includes a computer main body 3a and a peripheral device 3d which is connected to the computer main body 3a. The computer main body 3a includes a CPU 3b (central processing unit) which executes various types of commands and a main storage device 3c which stores information. The peripheral device 3d includes an auxiliary storage device 3e which stores information such as a program P, a reading device 3f which reads information from a removable medium RM and a communication device 3g which communicates with other devices such as a host computer.

The controller 3 is connected to an input device and a display. The input device is operated when an operator such as a user or a maintenance operator inputs information to the substrate processing apparatus 1. The information is displayed on the screen of the display. The input device may be any one of a keyboard, a pointing device and a touch panel or may be a device other than those. A touch panel display which serves both as the input device and the display may be provided in the substrate processing apparatus 1.

The CPU 3b executes the program P stored in the auxiliary storage device 3e. The program P within the auxiliary storage device 3e may be previously installed in the controller 3, may be fed through the reading device 3f from the removable medium RM to the auxiliary storage device 3e or may be fed from an external device such as the host computer to the auxiliary storage device 3e through the communication device 3g.

The auxiliary storage device 3e and the removable medium RM are nonvolatile memories which retain memory even without power being supplied. The auxiliary storage device 3e is, for example, a magnetic storage device such as a hard disk drive. The removable medium RM is, for example, an optical disc such as a compact disc or a semiconductor memory such as a memory card. The removable medium RM is an example of a computer readable recording medium in which the program P is recorded. The removable medium RM is a non-transitory tangible recording medium.

The auxiliary storage device 3e stores a plurality of recipes. The recipe is information which specifies the details of processing, processing conditions and processing procedures of the substrate W. A plurality of recipes differ from each other in at least one of the details of processing, the processing conditions, and the processing procedures of the substrate W. The controller 3 controls the substrate processing apparatus 1 such that the substrate W is processed according to the recipe designated by the host computer. The controller 3 is programmed to execute the individual steps described below.

Figure 6:
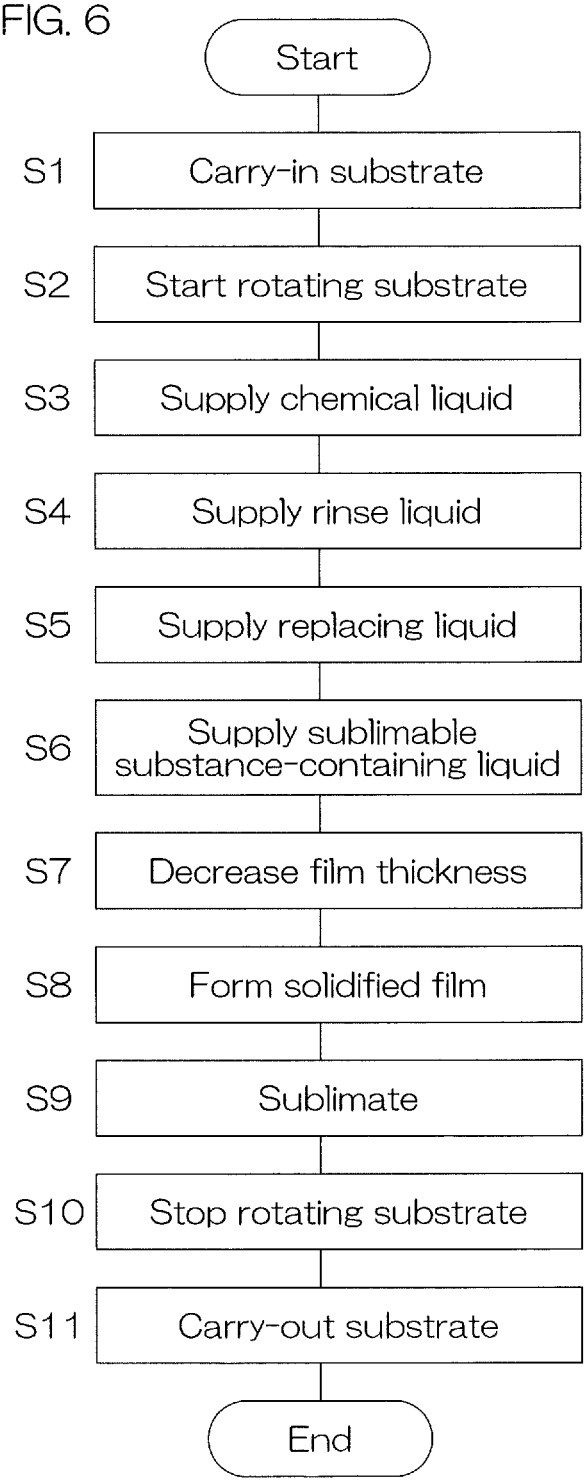
FIG. 6 is a process chart for describing an example of a processing of a substrate which is executed by the substrate processing apparatus.

FIG. 6 is a process chart for describing an example of the processing of the substrate W which is executed by the substrate processing apparatus 1. FIG. 2 and FIG. 6 shall be referenced in the following.

For example, the substrate W to be processed is a semiconductor wafer such as a silicon wafer. The front surface of the substrate W corresponds to the device formation surface on which devices such as transistors or capacitors are formed. The substrate W may be a substrate W having patterns P1 (see FIG. 7A) formed on the front surface of the substrate W corresponding to a pattern formation surface, or alternatively, may be a substrate W having no patterns P1 formed on the front surface of the substrate W. In the latter case, the patterns P1 may be formed in a chemical liquid supplying step described below.

When the substrate W is processed by the substrate processing apparatus 1, a carry-in step (step S1 in FIG. 6) is performed to carry the substrate W into the chamber 4.

Specifically, while the shielding member 51 is located at the upper position, all the guards 24 are located at the lower position, and all scan nozzles are located at the standby position, the center robot CR (see FIG. 1A) causes a hand H1 to enter the chamber 4 while supporting the substrate W with the hand H1. Then, the center robot CR places the substrate W in the hand H1 on the plurality of chuck pins 11 while the front surface of the substrate W is directed upwardly. Thereafter, the plurality of chuck pins 11 are pushed against the outer circumferential surface of the substrate W to thereby grip the substrate W. The center robot CR retracts the hand H1 out of the chamber 4 after having placed the substrate W on the spin chuck 10.

Next, the upper gas valve 64 and the lower gas valve 84 are opened, and the upper central opening 61 of the shielding member 51 and the lower central opening 81 of the spin base 12 start to discharge the nitrogen gas. This allows the space between the substrate W and the shielding member 51 to be filled with the nitrogen gas. Similarly, the space between the substrate W and the spin base 12 is filled with the nitrogen gas. Meanwhile, the guard elevating/lowering unit 27 elevates at least one guard 24 from the lower position to the upper position. Thereafter, the spin motor 14 is driven, and the rotation of the substrate W is started (step S2 in FIG. 6). This allows the substrate W to be rotated at a liquid supplying speed.

Next, the chemical liquid supplying step (step S3 in FIG. 6) is performed to supply a chemical liquid onto the upper surface of the substrate W and thereby form a liquid film of the chemical liquid that covers the entire upper surface of the substrate W.

Specifically, with the shielding member 51 located at the upper position and at least one guard 24 located at the upper position, the nozzle moving unit 34 moves the chemical liquid nozzle 31 from the standby position to the processing position. Thereafter, the chemical liquid valve 33 is opened, and the chemical liquid nozzle 31 starts to discharge the chemical liquid. When a predetermined time has elapsed after the chemical liquid valve 33 is opened, the chemical liquid valve 33 is closed, so that the discharge of the chemical liquid is stopped. Thereafter, the nozzle moving unit 34 moves the chemical liquid nozzle 31 to the standby position.

The chemical liquid discharged from the chemical liquid nozzle 31 collides with the upper surface of the substrate W that is rotating at the liquid supplying speed, and then, flows outwardly along the upper surface of the substrate W due to centrifugal force. Thus, the chemical liquid is supplied to the entire upper surface of the substrate W to thereby form the liquid film of the chemical liquid that covers the entire upper surface of the substrate W. While the chemical liquid nozzle 31 is discharging the chemical liquid, the nozzle moving unit 34 may move a liquid landing position so that the liquid landing position of the chemical liquid passes the center portion and the outer circumference portion of the upper surface of the substrate W, or alternatively, may bring the liquid landing position to a standstill at the center portion.

Next, a rinse liquid supplying step (step S4 in FIG. 6) is performed to supply pure water serving as an example of rinse liquid to the upper surface of the substrate W and thereby wash away the chemical liquid on the substrate W.

Specifically, with the shielding member 51 located at the upper position and at least one guard 24 located at the upper position, the nozzle moving unit 38 moves the rinse liquid nozzle 35 from the standby position to the processing position. Thereafter, the rinse liquid valve 37 is opened, and the rinse liquid nozzle 35 starts to discharge the rinse liquid. Before the pure water starts to be discharged, the guard elevating/lowering unit 27 may vertically move at least one guard 24 in order to switch the guard 24 that receives the liquid discharged from the substrate W. When a predetermined time has elapsed after the rinse liquid valve 37 is opened, the rinse liquid valve 37 is closed, so that the discharge of the rinse liquid is stopped. Thereafter, the nozzle moving unit 38 moves the rinse liquid nozzle 35 to the standby position.

The pure water discharged from the rinse liquid nozzle 35 collides with the upper surface of the substrate W that is rotating at the liquid supplying speed, and then, flows outwardly along the upper surface of the substrate W due to centrifugal force. The chemical liquid on the substrate W is replaced with the pure water discharged from the rinse liquid nozzle 35. This allows a liquid film of the pure water covering the entire upper surface of the substrate W to be formed. While the rinse liquid nozzle 35 is discharging the pure water, the nozzle moving unit 38 may move a liquid landing position so that the liquid landing position of the pure water passes the center portion and the outer circumference portion of the upper surface of the substrate W, or alternatively, may bring the liquid landing position to a standstill at the center portion.

Next, a replacing liquid supplying step (step S5 in FIG. 6) is performed to supply a replacing liquid that dissolves with both the rinse liquid and the sublimable substance-containing liquid to the upper surface of the substrate W and then replace the pure water on the substrate W with the replacing liquid.

Specifically, with the shielding member 51 located at the upper position and at least one guard 24 located at the upper position, the nozzle moving unit 46 moves the replacing liquid nozzle 43 from the standby position to the processing position. Thereafter, the replacing liquid valve 45 is opened, and the replacing liquid nozzle 43 starts to discharge the replacing liquid. Before the replacing liquid starts to be discharged, the guard elevating/lowering unit 27 may vertically move at least one guard 24 in order to switch the guard 24 that receives the liquid discharged from the substrate W. When a predetermined time has elapsed after the replacing liquid valve 45 is opened, the replacing liquid valve 45 is closed, so that the discharge of the replacing liquid is stopped. Thereafter, the nozzle moving unit 46 moves the replacing liquid nozzle 43 to the standby position.

The replacing liquid discharged from the replacing liquid nozzle 43 collides with the upper surface of the substrate W that is rotating at the liquid supplying speed, and then, flows outwardly along the upper surface of the substrate W due to centrifugal force. The pure water on the substrate W is replaced with the replacing liquid discharged from the replacing liquid nozzle 43. This allows a liquid film of the replacing liquid covering the entire upper surface of the substrate W to be formed. While the replacing liquid nozzle 43 is discharging the replacing liquid, the nozzle moving unit 46 may move a liquid landing position so that the liquid landing position of the replacing liquid passes the center portion and the outer circumference portion of the upper surface of the substrate W, or alternatively, may bring the liquid landing position to a standstill at the center portion. After the liquid film of the replacing liquid covering the entire upper surface of the substrate W is formed, the substrate W may be rotated at a paddle speed (e.g., at a speed greater than zero and 20 rpm or less) while the discharge of the replacing liquid from the replacing liquid nozzle 43 is stopped.

Next, a sublimable substance-containing liquid supplying step (step S6 in FIG. 6) is performed to supply the sublimable substance-containing liquid to the upper surface of the substrate W and thereby form a liquid film of the sublimable substance-containing liquid on the substrate W.

Specifically, with the shielding member 51 located at the upper position and at least one guard 24 located at the upper position, the nozzle moving unit 42 moves the sublimable substance-containing liquid nozzle 39 from the standby position to the processing position. Thereafter, the sublimable substance-containing liquid valve 41 is opened, and the sublimable substance-containing liquid nozzle 39 starts to discharge the sublimable substance-containing liquid. Before the sublimable substance-containing liquid starts to be discharged, the guard elevating/lowering unit 27 may vertically move at least one guard 24 in order to switch the guard 24 that receives the liquid discharged from the substrate W. When a predetermined time has elapsed after the sublimable substance-containing liquid valve 41 is opened, the sublimable substance-containing liquid valve 41 is closed, so that the discharge of the sublimable substance-containing liquid is stopped. Thereafter, the nozzle moving unit 42 moves the sublimable substance-containing liquid nozzle 39 to the standby position.

The sublimable substance-containing liquid discharged from the sublimable substance-containing liquid nozzle 39 collides with the upper surface of the substrate W that is rotating at the liquid supplying speed, and then, flows outwardly along the upper surface of the substrate W due to centrifugal force. The replacing liquid on the substrate W is replaced with the sublimable substance-containing liquid discharged from the sublimable substance-containing liquid nozzle 39. This allows a liquid film of the sublimable substance-containing liquid covering the entire upper surface of the substrate W to be formed. While the sublimable substance-containing liquid nozzle 39 is discharging the sublimable substance-containing liquid, the nozzle moving unit 42 may move a liquid landing position so that the liquid landing position of the sublimable substance-containing liquid passes the center portion and the outer circumference portion of the upper surface of the substrate W, or alternatively, may bring the liquid landing position to a standstill at the center portion.

Next, a film thickness decreasing step (step S7 in FIG. 6) is performed to remove some of the sublimable substance-containing liquid on the substrate W and decrease the film thickness (the thickness of the liquid film) of the sublimable substance-containing liquid on the substrate W while maintaining the state that the entire upper surface of the substrate W is covered with the liquid film of the sublimable substance-containing liquid.

Specifically, with the shielding member 51 located at the lower position, the spin motor 14 maintains the rotational speed of the substrate W at a film thickness decreasing speed. The film thickness decreasing speed may be equal to or different from the liquid supplying speed. The sublimable substance-containing liquid on the substrate W is discharged outwardly from the substrate W due to centrifugal force even after the discharge of the sublimable substance-containing liquid is stopped. Thus, the thickness of the liquid film of the sublimable substance-containing liquid on the substrate W is decreased. When the sublimable substance-containing liquid on the substrate W is discharged to a certain extent, the amount of the sublimable substance-containing liquid discharged from the substrate W per unit time is reduced to zero or generally zero. Thereby, the thickness of the liquid film of the sublimable substance-containing liquid on the substrate W is stabilized at a value corresponding to the rotational speed of the substrate W.

Next, a solidified film forming step (step S8 in FIG. 6) is performed to evaporate the solvent from the sublimable substance-containing liquid on the substrate W and to form a solidified film SF (refer to FIG. 76), which includes the sublimable substance, on the substrate W.

Specifically, with the shielding member 51 located at the lower position, the spin motor 14 maintains the rotational speed of the substrate W at a solidified film forming speed. The solidified film forming speed may be equal to or different from the liquid supplying speed. Furthermore, the upper gas valve 57 is opened and the central nozzle 55 starts to discharge the nitrogen gas. The flow rate of the nitrogen gas to be discharged from the upper central opening 61 of the shielding member 51 may be increased by changing the opening degree of the flow rate adjusting valve 65, in addition to or instead of opening the upper gas valve 57.

When the rotation of the substrate W at the solidified film forming speed and so on are started, the evaporation of the sublimable substance-containing liquid is facilitated and some of the sublimable substance-containing liquid on the substrate W evaporates. Since the vapor pressure of the solvent is higher than the vapor pressure of the sublimable substance corresponding to the solute, the solvent evaporates at an evaporation speed higher than an evaporation speed of the sublimable substance. Thus, the film thickness of the sublimable substance-containing liquid gradually decreases while the concentration of the sublimable substance gradually increases. The freezing point of the sublimable substance-containing liquid rises as the concentration of sublimable material rises. When the freezing point of the sublimable substance-containing liquid matches the temperature of the sublimable substance-containing liquid, the sublimable substance-containing liquid starts to solidify and the solidified film SF corresponding to a solidified body covering the entire upper surface of the substrate W is formed.

Next, a sublimating step (step S9 in FIG. 6) is performed to sublimate the solidified film SF on the substrate W and remove it from the upper surface of the substrate W.

Specifically, with the shielding member 51 located at the lower position, the spin motor 14 maintains the rotational speed of the substrate W at a sublimating speed. The sublimating speed may be equal to or different from the liquid supplying speed. Furthermore, in a case where the upper gas valve 57 is closed, the upper gas valve 57 is opened and the central nozzle 55 starts to discharge the nitrogen gas. In addition to or in place of opening the upper gas valve 57, the opening degree of the flow rate adjusting valve 65 may be changed to increase the flow rate of the nitrogen gas discharged from the upper central opening 61 of the shielding member 51. When a predetermined time has elapsed after the rotation of the substrate W at the sublimating speed is started, the spin motor 14 stops and the rotation of the substrate W is stopped (step S10 in FIG. 6).

When the rotation of the substrate W at the sublimating speed and so on are started, the solidified film SF on the substrate W starts to sublimate, so that a gas containing a sublimable substance is generated from the solidified film SF on the substrate W. The gas generated from the solidified film SF (a gas containing the sublimable substance) radially flows through the space between the substrate W and the shielding member 51 and is removed from the space over the substrate W. When a certain time has elapsed after the sublimating started, all of the solidified film SF is removed from the substrate W.

Next, a carry-out step (step S11 in FIG. 6) is performed to carry the substrate W out of the chamber 4.

Specifically, the shielding member elevating/lowering unit 54 elevates the shielding member 51 to the upper position, and the guard elevating/lowering unit 27 lowers all the guards 24 to the lower position. Furthermore, the upper gas valve 64 and the lower gas valve 84 are closed, so that the upper central opening 61 of the shielding member 51 and the lower central opening 81 of the spin base 12 stop discharging the nitrogen gas. Thereafter, the center robot CR causes the hand H1 to enter the chamber 4. After the plurality of chuck pins 11 release the gripping of the substrate W, the center robot CR supports the substrate W on the spin chuck 10 with the hand H1. Thereafter, while supporting the substrate W with the hand H1, the center robot CR retracts the hand H1 out of the chamber 4. This allows the processed substrate W to be carried out of the chamber 4.

FIG. 7A to FIG. 7F are schematic views for describing phenomena that are expected to occur in the processing of the substrate W shown in FIG. 6 during the period of time from supplying the upper surface of the substrate W with the sublimable substance-containing liquid to removing the solidified film SF from the upper surface of the substrate W.

In the following, a case where the entire surface of the pattern P1 is hydrophilic and the sublimable substance, which includes the hydrophilic group, and IPA serving as the solvent are contained in the sublimable substance-containing liquid will be described. In the description below, it is to be understood that the solubility of the sublimable substance having the hydrophilic group in water is larger than the solubility of IPA in water.

Figure 7A:
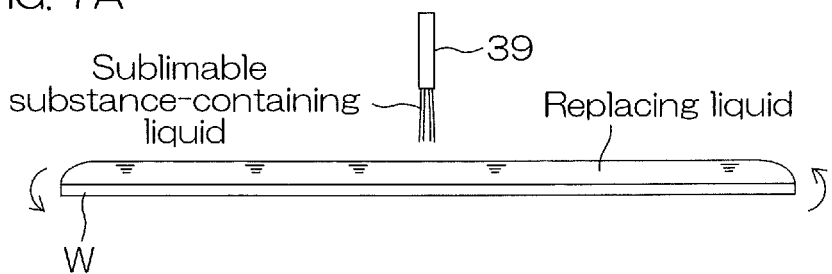
FIG. 7A is a schematic view for describing phenomena that are expected to occur in the processing of the substrate shown in FIG. 6 during the period of time from supplying an upper surface of the substrate with the sublimable substance-containing liquid to removing the solidified film from the upper surface of the substrate.
Figure 7B:
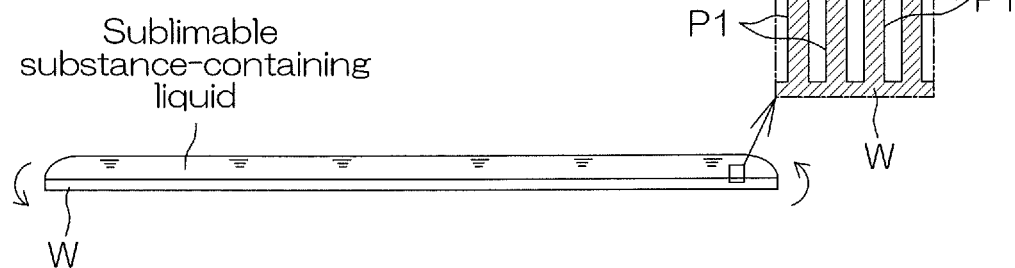
FIG. 7B is a schematic view for describing the phenomena.
Figure 7C:
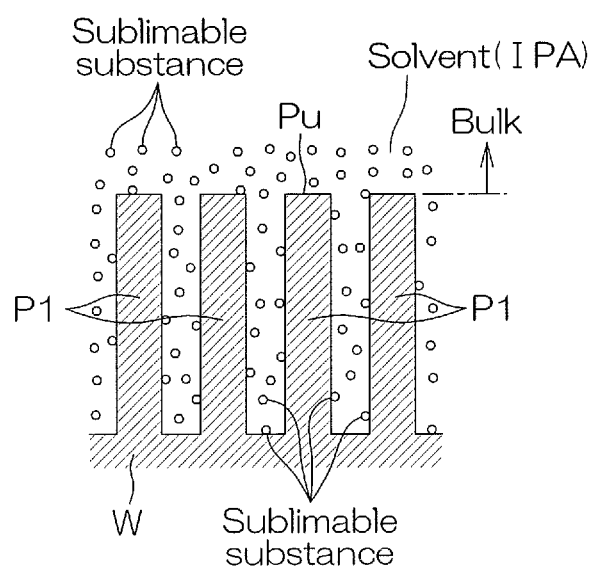
FIG. 7C is a schematic view for describing the phenomena.

As shown in FIG. 7A, the sublimable substance-containing liquid is supplied to the upper surface of the substrate W with the substrate W rotating and the upper surface of the substrate W covered with a liquid film of the replacing liquid. Thus, as shown in FIG. 76, the replacing liquid is discharged from areas between the patterns P1 and the areas between the patterns P1 are filled with the sublimable substance-containing liquid. FIG. 7C shows the distribution of the sublimable substances in the sublimable substance-containing liquid supplied to the upper surface of the substrate W. In FIG. 7C, the sublimable substances are represented by circles.

A single molecule of IPA includes a hydroxy group, which is an example of the hydrophilic group, and two methyl groups which are an example of the hydrophobic group. Thus, while an attractive force is applied to IPA to attract it to the surface of the pattern P1, a repulsive force is also applied to IPA to keep it away from the surface of the pattern P1. Furthermore, the sublimable substance having the hydrophilic group has a higher affinity for the surface of the pattern P1 than IPA. Thus, it is considered that IPA is less likely to be retained on the surface of the pattern P1, compared to the sublimable substance.

Figure 7D:
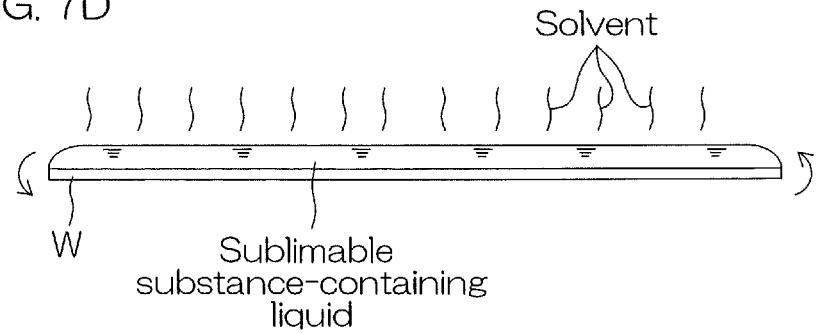
FIG. 7D is a schematic view for describing the phenomena.
Figure 7E:
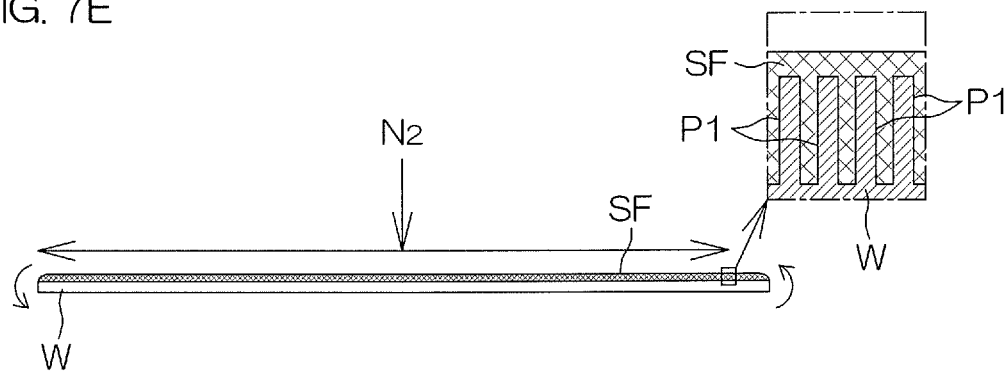
FIG. 7E is a schematic view for describing the phenomena.
Figure 7F:
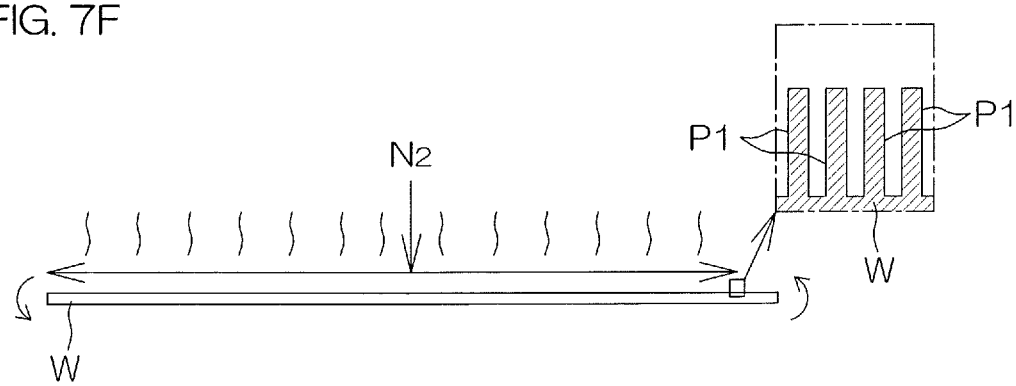
FIG. 7F is a schematic view for describing the phenomena.

As shown in FIG. 7D, after the upper surface of the substrate W is covered with the liquid film of the sublimable substance-containing liquid, the solvent is evaporated from the sublimable substance-containing liquid on the substrate W. When the solvent evaporates, the concentration of the sublimable substance increases. The freezing point of the sublimable substance-containing liquid rises as the concentration of the sublimable substance rises. When the freezing point of the sublimable substance-containing liquid matches the temperature of the sublimable substance-containing liquid, as shown in FIG. 7E, the solidification of the sublimable substance-containing liquid starts and the solidified film SF corresponding to the solidified body covering the entire upper surface of the substrate W is formed. After that, as shown in FIG. 7F, the solidified film SF is sublimated and removed from the upper surface of the substrate W.

When the solidified film SF is being formed, the solvent is evaporated from a bulk portion (refer to FIG. 7C) of the liquid film of the sublimable substance-containing liquid, that is, a liquid layer located in a range from the upper surface (liquid surface) of the liquid film of the sublimable substance-containing liquid to the upper surface Pu of the pattern P1, and the concentration of the sublimable substance in the bulk portion of the liquid film rises. IPA contained in the sublimable substance-containing liquid existing between the patterns P1 moves to the bulk portion of the liquid film and is released into the air from the upper surface of the sublimable substance-containing liquid. Thus, the concentration of the sublimable substance increases not only above the patterns P1 but also between the patterns P1. Accordingly, as shown in FIG. 7E, it is considered that after the solidified film SF is formed, the liquid IPA is discharged from between the patterns P1 and an area between two adjacent projecting patterns P1 is filled with the solidified film SF.

FIG. 8A to FIG. 8D are cross-sectional views of the substrate W for describing phenomena that are expected to occur in the processing of the substrate W shown in FIG. 6 during the period of time from supplying the upper surface of the substrate W with the sublimable substance-containing liquid to removing the solidified film SF from the upper surface of the substrate W.

In the following, a case where the entire surface of the pattern P1 is hydrophilic and the sublimable substance, which includes the hydrophilic group, and methanol serving as the solvent are contained in the sublimable substance-containing liquid will be described. The processing conditions for the substrate W are the same as those for the substrate W described with reference to FIG. 7A to FIG. 7F, except that the solvent is methanol instead of IPA. In the description below, it is to be understood that the solubility of the sublimable substance having the hydrophilic group in water is smaller than the solubility of methanol in water.

Figure 8A:
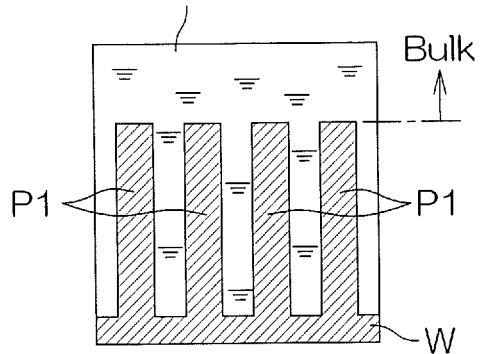
FIG. 8A is a schematic view for describing phenomena that are expected to occur in the processing of the substrate shown in FIG. 6 during the period of time from supplying the upper surface of the substrate with the sublimable substance-containing liquid to removing the solidified film from the upper surface of the substrate.

As with the processing of the substrate W described with reference to FIG. 7A to FIG. 7F, the sublimable substance-containing liquid containing methanol serving as the solvent is supplied to the upper surface of the substrate W with the substrate W rotating and the upper surface of the substrate W covered with the liquid film of the replacing liquid. Thus, the replacing liquid is discharged from areas between the patterns P1 and the areas between the patterns P1 are filled with the sublimable substance-containing liquid. FIG. 8A shows a state where the areas between the patterns P1 are filled the sublimable substance-containing liquid containing the sublimable substance and the solvent (methanol).

A single molecule of methanol includes a hydroxy group, which is an example of the hydrophilic group, and a methyl group which is an example of the hydrophobic group. Thus, while an attractive force is applied to methanol to attract it to the surface of the pattern P1, a repulsive force is also applied to methanol to keep it away from the surface of the pattern P1. However, compared to IPA, the number of the methyl groups contained in one molecule is small. Thus, it is considered that methanol is likely to be held by the surface of the pattern P1 compared to IPA. Furthermore, the sublimable substance having the hydrophilic group has less affinity with respect to the surface of the pattern P1 than methanol. Thus, it is considered that methanol is likely to be held by the surface of the pattern P1 compared to the sublimable substance.

Figure 8B:
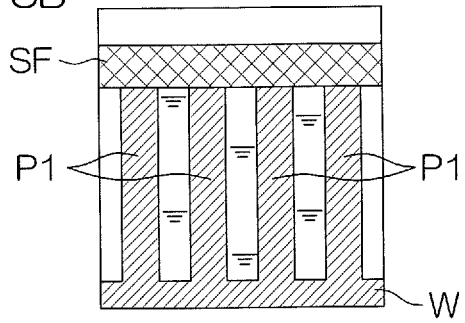
FIG. 8B is a schematic view for describing the phenomena.

When the solidified film SF is being formed, methanol contained in the sublimable substance-containing liquid existing between the patterns P1 moves to a bulk portion (refer to FIG. 8A) of the liquid film of the sublimable substance-containing liquid, and is released into the air from the upper surface of the sublimable substance-containing liquid. However, since the force to hold methanol on the surface of the pattern P1 is relatively strong, it is difficult for methanol to be discharged from between the patterns P1. Thus, the concentration of the sublimable substance in the sublimable substance-containing liquid existing between the patterns P1 does not rise easily. It is considered that, due to this, methanol may remain between the patterns P1 after the bulk portion of the liquid film changes to the solidified film SF. FIG. 8B shows an example where after the solidified film SF is formed above the patterns P1, the areas between the patterns P1 are filled with methanol.

Figure 8C:
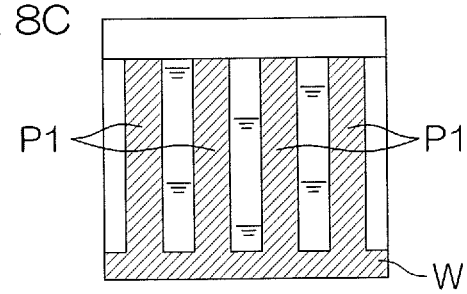
FIG. 8C is a schematic view for describing the phenomena.
Figure 8D:
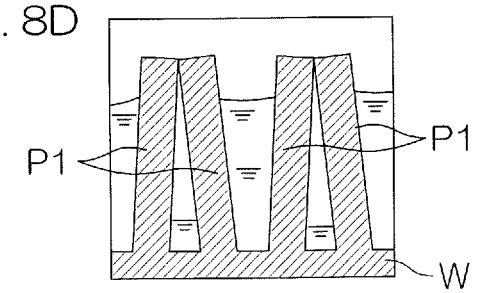
FIG. 8D is a schematic view for describing the phenomena.

In the case of the example shown in FIG. 8B, as shown in FIG. 8C, methanol remains between the patterns P1 even after the solidified film SF is sublimated. Methanol remaining between the patterns P1 is removed from the substrate W by evaporation. However, until methanol is removed from the substrate W, a liquid surface (interface between gas and liquid) of methanol is formed between two adjacent projecting patterns P1, and the collapsing force to collapse the patterns P1 is applied to the patterns P1 from methanol. When the strength of the pattern P1 is low, as shown in FIG. 8D, the pattern P1 collapses even with such a collapsing force.

In this way, if the surface of the pattern P1 is hydrophilic and the solvent has strong hydrophilicity, when the solidified film SF is being formed, the solvent is not discharged from between the patterns P1 and remains between the patterns P1, and the collapsing force to collapse the patterns P1 is applied to the patterns P1 from the solvent. Similarly, if the surface of the pattern P1 is hydrophobic and the solvent has strong hydrophobicity, when the solidified film SF is being formed, the solvent is not discharged from between the patterns P1 and remains between the patterns P1, and the collapsing force to collapse the patterns P1 is applied to the patterns P1 from the solvent. Thus, if the solvent is not selected in consideration of the affinity between the solvent and the pattern P1, the collapse of the pattern P1 occurs depending on the strength of the pattern P1.

As described above, in the preferred embodiment, the sublimable substance-containing liquid containing the sublimable substance, which corresponds to the solute, and the solvent is supplied to the front surface of the substrate W on which the pattern P1 is formed. After that, the solvent is evaporated from the sublimable substance-containing liquid. Thus, the solidified film SF including the sublimable substance is formed on the front surface of the substrate W. After that, the solidified film SF on the substrate W is changed to gas without passing through to a liquid. Thus, the solidified film SF is removed from the front surface of the substrate W. Accordingly, it is possible to lower the collapse rate of the patterns P1 as compared to the conventional drying method such as spin drying.

In a case where the surface of the pattern P1 is hydrophilic, the solvent having less solubility in water than that of the sublimable substance is contained in the sublimable substance-containing liquid. When the surface of the pattern P1 is hydrophilic and the hydrophilicity of the solvent is high, the solvent is likely to be held on the surface of the pattern, so that a lot of the solvent remains between the patterns P1 even after forming the solidified film SF. In this case, the collapsing force to collapse the pattern P1 is applied to the pattern P1 from the solvent. It is possible to reduce the solvent remaining between the patterns P1 after forming the solidified film SF to zero or a value close to it by using the solvent having low hydrophilicity.

In a case where the surface of the pattern P1 is hydrophobic, the solvent having less solubility in oil than that of the sublimable substance is contained in the sublimable substance-containing liquid. When the surface of the pattern P1 is hydrophobic and the hydrophobicity of the solvent is high, the solvent is likely to be held on the surface of the pattern, so that a lot of the solvent remains between the patterns P1 even after forming the solidified film SF. In this case, the collapsing force to collapse the pattern P1 is applied to the pattern P1 from the solvent. It is possible to reduce the solvent remaining between the patterns P1 after forming the solidified film SF to zero or a value close to it by using the solvent having low hydrophobicity.

In this way, the solvent contained in the sublimable substance-containing liquid has less affinity with respect to the surface of the pattern P1 than the sublimable substance contained in the sublimable substance-containing liquid regardless of whether the surface of the pattern P1 is hydrophilic or hydrophobic. Thus, it is possible to reduce the solvent remaining between the patterns P1 after forming the solidified film SF and to weaken the collapsing force applied to the pattern P1 during and after the solidified film SF is formed. Accordingly, it is possible to dry the substrate W with the low collapse rate of the pattern P1 regardless of whether the surface of the pattern P1 is hydrophilic or hydrophobic.

In the preferred embodiment, in a case where the hydrophilic portion and the hydrophobic portion are included in the surface of the pattern, if the upper end portion Px of the side surface Ps of the pattern P1 is hydrophilic, the surface of the pattern P1 is regarded as hydrophilic. In a case where the hydrophilic portion and the hydrophobic portion are included in the surface of the pattern, if the upper end portion Px of the side surface Ps of the pattern P1 is hydrophobic, the surface of the pattern P1 is regarded as hydrophobic. That is, it is determined whether the surface of the pattern P1 is hydrophilic or hydrophobic based on the property of the upper end portion Px of the side surface Ps of the pattern P1.

When a liquid surface (interface between gas and liquid) is formed between two adjacent projecting patterns P1, the collapsing force due to the surface tension is applied to the patterns P1. This collapsing force increases as a distance from the root of the pattern P1 to the liquid surface increases. Thus, even when the liquid surface is formed between the two adjacent projecting patterns P1, if the distance from the root (lower end) of the pattern P1 to the liquid surface is short, the collapsing force applied to the pattern P1 is weak.

If the surface of the pattern P1 is regarded as hydrophobic when the hydrophilic portion and the hydrophobic portion are included in the surface of the pattern P1 and the upper end portion Px of the side surface Ps of the pattern P1 is hydrophilic, it is likely that the liquid surface of the solvent is formed at the upper end portion Px of the side surface Ps of the pattern P1 after forming the solidified film SF and the large collapsing force is applied to the pattern P1. If the surface of the pattern P1 is regarded as hydrophilic, even when the liquid surface of the solvent is formed between the patterns P1, the liquid surface of the solvent is disposed on the root side of the pattern P1. Thus, it is possible to shorten the distance from the root of the pattern P1 to the liquid surface.

For the same reason, if the surface of the pattern P1 is regarded as hydrophobic when the hydrophilic portion and the hydrophobic portion are included in the surface of the pattern P1 and the upper end portion Px of the side surface Ps of the pattern P1 is hydrophobic, even when the liquid surface of the solvent is formed between the patterns P1, it is possible to shorten the distance from the root of the pattern P1 to the liquid surface. Thus, it is possible to weaken the collapsing force applied to the pattern P1 and to lower the collapse rate of the pattern P1.

Next, description will be made to a second preferred embodiment.

The second preferred embodiment is different from the first preferred embodiment mainly in that the sublimable substance-containing liquid is manufactured just before the sublimable substance-containing liquid is supplied to the substrate W.

Figure 9:
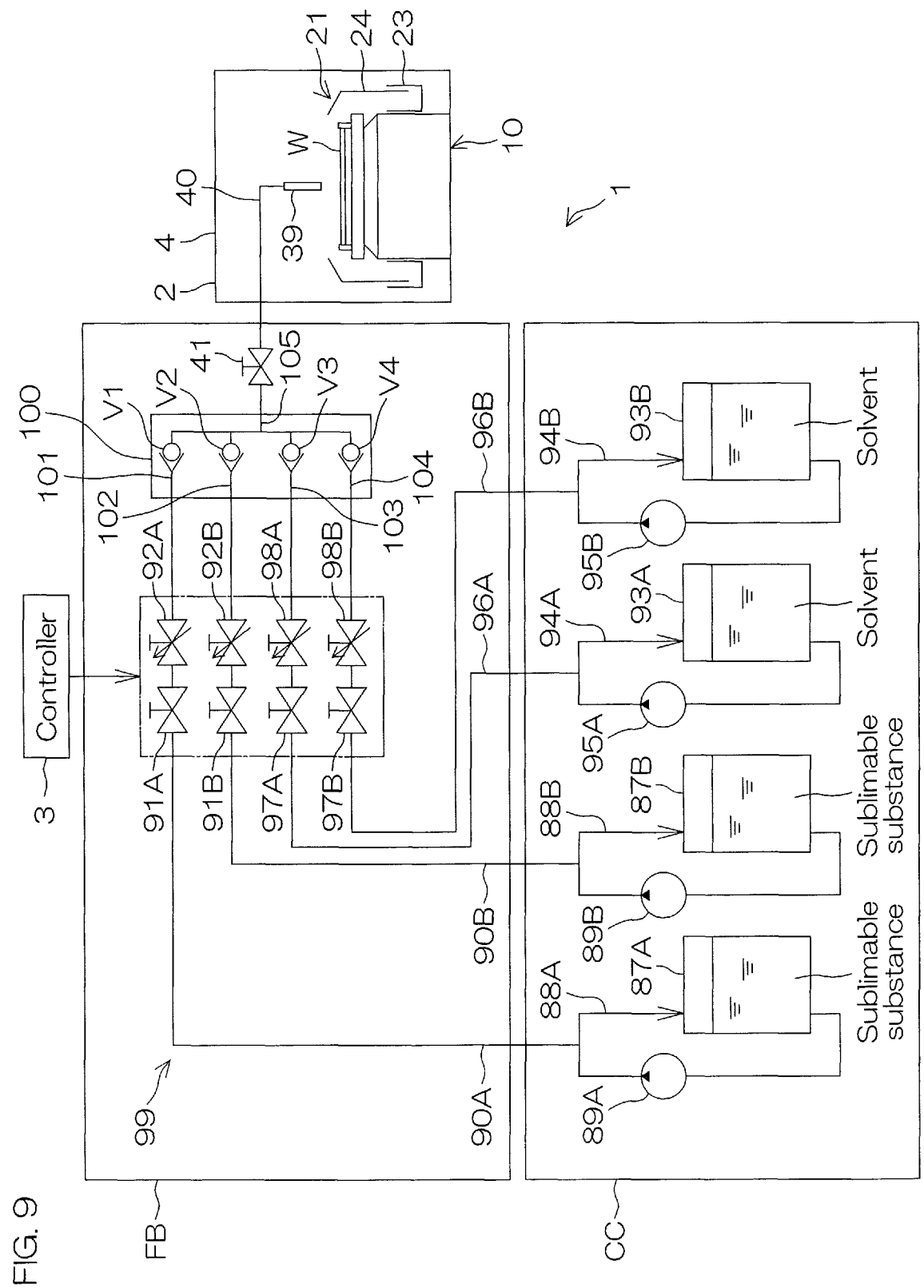
FIG. 9 is a schematic view showing a sublimable substance-containing liquid supplying unit provided in a substrate processing apparatus according to a second preferred embodiment of the present invention.

In FIG. 9 to FIG. 10 below, the same components as those shown in FIG. 1 to FIG. 8D will be given the same reference symbols as those of FIG. 1 and so on, and the description thereof will be omitted.

FIG. 9 is a schematic view showing the sublimable substance-containing liquid supplying unit 99 provided in the substrate processing apparatus 1 according to the second preferred embodiment of the present invention.

The sublimable substance-containing liquid supplying unit 99 includes a first undiluted liquid tank 87A that stores a liquid containing the sublimable substance and a second undiluted liquid tank 876 that stores a liquid containing the sublimable substance. The liquid in the first undiluted liquid tank 87A contains the sublimable substance having the hydrophilic group. The liquid in the second undiluted liquid tank 876 contains the sublimable substance having the hydrophobic group. The liquid in the first undiluted liquid tank 87A and the liquid in the second undiluted liquid tank 876 are different from each other in at least one component. The liquid in the first undiluted liquid tank 87A may be a melt of the sublimable substance. If the concentration of the sublimable substance is high, the liquid in the first undiluted liquid tank 87A may be a solution containing the sublimable substance and the solvent, or may contain the sublimable substance and a substance other than the solvent. The same applies to the liquid in the second undiluted liquid tank 876.

The sublimable substance-containing liquid supplying unit 99 includes a first diluting liquid tank 93A that stores the solvent and a second diluting liquid tank 93B that stores the solvent. The solvent in the first diluting liquid tank 93A and the solvent in the second diluting liquid tank 93B are different from each other in at least one component. The solvent in the first diluting liquid tank 93A may be a melt of the solvent, may be an aqueous solution of the solvent, or may contain the solvent and a substance other than the solvent. The same applies to the solvent in the second diluting liquid tank 93B. The solvent in the first diluting liquid tank 93A and the solvent in the second diluting liquid tank 93B may be alcohol.

The liquid in the first undiluted liquid tank 87A is sent to a circulation piping 88A by a pump 89A and returns to the first undiluted liquid tank 87A from the circulation piping 88A. The liquid in the second undiluted liquid tank 876 is sent to a circulation piping 88B by a pump 89B and returns to the second undiluted liquid tank 876 from the circulation piping 88B. The circulation piping 88A is connected to an individual piping 90A in which an opening and closing valve 91A and a flow rate adjusting valve 92A are interposed. The circulation piping 88B is connected to an individual piping 90B in which an opening and closing valve 91B and a flow rate adjusting valve 92B are interposed. Downstream ends of the individual piping 90A and the individual piping 90B are connected to the sublimable substance-containing liquid piping 40 via a mixing valve 100.

The solvent in the first diluting liquid tank 93A is sent to a circulation piping 94A by a pump 95A and returns to the first diluting liquid tank 93A from the circulation piping 88A. The solvent in the second diluting liquid tank 93B is sent to a circulation piping 94B by a pump 95B and returns to the second diluting liquid tank 93B from the circulation piping 94B. The circulation piping 94A is connected to an individual piping 96A in which an opening and closing valve 97A and a flow rate adjusting valve 98A are interposed. The circulation piping 94B is connected to an individual piping 96B in which an opening and closing valve 976 and a flow rate adjusting valve 98B are interposed. Downstream ends of the individual piping 96A and the individual piping 96B are connected to the sublimable substance-containing liquid piping 40 via the mixing valve 100.

The mixing valve 100 includes an individual flow passage 101, an individual flow passage 102, an individual flow passage 103, and an individual flow passage 104 connected to the individual piping 90A, the individual piping 90B, the individual piping 96A, and the individual piping 96B, respectively. The mixing valve 100 further includes a first check valve V1 that prevents backflow of liquid at the individual flow passage 101, a second check valve V2 that prevents backflow of liquid at the individual flow passage 102, a third check valve V3 that prevents backflow of liquid at the individual flow passage 103, a fourth check valve V4 that prevents backflow of liquid at the individual flow passage 104, and a collecting flow passage 105 that is connected to downstream ends of the individual flow passage 101, the individual flow passage 102, the individual flow passage 103, and the individual flow passage 104.

Opening and closing of the opening and closing valve 91A, the opening and closing valve 91B, the opening and closing valve 97A, and the opening and closing valve 976 and opening degrees of the flow rate adjusting valve 92A, the flow rate adjusting valve 92B, the flow rate adjusting valve 98A, and the flow rate adjusting valve 98B are controlled by the controller 3. When the opening and closing valve 91A is opened, the liquid containing the sublimable substance in the first undiluted liquid tank 87A is supplied to the mixing valve 100 at a flow rate corresponding to the opening degree of the flow rate adjusting valve 92A. The same applies when each of the opening and closing valve 91B, the opening and closing valve 97A, and the opening and closing valve 976 is opened.

At least one of the opening and closing valve 91A and the opening and closing valve 91B and at least one of the opening and closing valve 97A and the opening and closing valve 976 are opened, the liquid, which contains the sublimable substance, and the solvent are supplied to the mixing valve 100 and mixed in the collecting flow passage 105 of the mixing valve 100. Thus, the liquid containing the sublimable substance is diluted with the solvent, and the sublimable substance-containing liquid is manufactured. The sublimable substance-containing liquid manufactured in the mixing valve 100 is supplied to the sublimable substance-containing liquid nozzle 39 from the sublimable substance-containing liquid piping 40 and discharged from the sublimable substance-containing liquid nozzle 39 toward the upper surface of the substrate W.

In a case where the surface of the pattern P1 is hydrophilic, the sublimable substance having the hydrophilic group and the solvent having less solubility in water than this sublimable substance are mixed in the mixing valve 100. That is, the opening and closing valve 91A, and the opening and closing valve 97A or the opening and closing valve 976 are opened by the controller 3. In a case where the surface of the pattern P1 is hydrophobic, the sublimable substance having the hydrophobic group and the solvent having less solubility in oil than this sublimable substance are mixed in the mixing valve 100. That is, the opening and closing valve 91B, and the opening and closing valve 97A or the opening and closing valve 976 are opened by the controller 3.

When the sublimable substance-containing liquid is supplied to the substrate W, at least one of the opening and closing valve 91A and the opening and closing valve 91B and at least one of the opening and closing valve 97A and the opening and closing valve 976 are opened. The plurality of valves to be opened may be specified in the recipe. In a case where information to determine whether the surface of the pattern P1 hydrophilic and hydrophobic is input to the controller 3, the controller 3 may select the plurality of valves to be opened. Such information includes, for example, information indicating material of the surface of the pattern P1, information indicating the type of liquid supplied to the substrate W before the sublimable substance-containing liquid is supplied, and so on.

It is noted that in a case where the liquid containing the sublimable substance contains a substance other than the sublimable substance (for example, the solvent), when at least one of the opening and closing valve 91A and the opening and closing valve 91B and at least one of the opening and closing valve 97A and the opening and closing valve 976 are opened, the liquid containing the sublimable substance is diluted with the solvent. In this case, the substance other than the sublimable substance may be a solvent having the same name as that of the solvent for diluting, or may be a substance other than the solvent for diluting. In the latter case, when the liquid containing the sublimable substance is diluted with the solvent, the concentration of the substance other than the sublimable substance is lowered to a value where effects of this substance on the processing of the substrate W can be ignored.

FIG. 10 is a process chart for describing another example of the sublimable substance-containing liquid supplying step shown in FIG. 6.

In the substrate processing apparatus 1 according to the second preferred embodiment, as with the first preferred embodiment, each of the steps shown in FIG. 6 is performed.

When the sublimable substance-containing liquid supplying step (step S6 in FIG. 6) is performed, the controller 3 determines whether or not the controller 3 should cause the sublimable substance-containing liquid nozzle 39 to discharge the sublimable substance-containing liquid (step S21 in FIG. 10). When there is no need to discharge (No in step S21 in FIG. 10), after a predetermined time elapsed, the controller 3 determines again whether or not the controller 3 should cause the sublimable substance-containing liquid to be discharged (return to step S21 in FIG. 10).

When there is need to discharge the sublimable substance-containing liquid (Yes in step S21 in FIG. 10), the controller 3 opens at least one of the opening and closing valve 91A and the opening and closing valve 91B and at least one of the opening and closing valve 97A and the opening and closing valve 976 (step S22 in FIG. 10). Thus, the liquid containing the sublimable substance and the solvent are mixed, and the sublimable substance-containing liquid is manufactured in the mixing valve 100. And the sublimable substance-containing liquid is discharged from the sublimable substance-containing liquid nozzle 39.

After the discharging the sublimable substance-containing liquid is started, the controller 3 determines whether or not a predetermined time has elapsed (step S23 in FIG. 10). When the predetermined time has not elapsed (No in step S23 in FIG. 10), the controller 3 determines again whether or not the predetermined time has elapsed (return to step S23 in FIG. 10). When the predetermined time has elapsed (Yes in step S23 in FIG. 10), the controller 3 closes the plurality of valves that have been opened in step S22 (step S24 in FIG. 10). Thus, the mixing of the liquid containing the sublimable substance and the solvent and the discharging the sublimable substance-containing liquid are stopped.

Other Preferred Embodiments

The present invention is not restricted to the contents of the above described preferred embodiments and various modifications are possible.

For example, in the first preferred embodiment, a tank for hydrophilicity that stores the sublimable substance-containing liquid for hydrophilicity to be supplied to the substrate W when the surface of the pattern P1 is hydrophilic, and a tank for hydrophilicity that stores the sublimable substance-containing liquid for hydrophobicity to be supplied to the substrate W when the surface of the pattern P1 is hydrophobic may be provided.

In this case, whether the surface of the pattern P1 is hydrophilic or hydrophobic, it is possible to supply the appropriate sublimable substance-containing liquid and to lower the collapse rate of the pattern P1. Which of the sublimable substance-containing liquid for hydrophilicity and the sublimable substance-containing liquid for hydrophobicity is to be supplied to the substrate W may be specified in the recipe, or the controller 3 may select it based on information input in the controller 3.

In the first preferred embodiment, the sublimable substance-containing liquid supplied from the undiluted liquid tank 87 may be mixed with the diluting liquid supplied from the diluting liquid tank 93 at a position other than the sublimable substance-containing liquid piping 40. For example, the sublimable substance-containing liquid may be mixed with the diluting liquid at an inside or insides of at least one of piping other than the sublimable substance-containing liquid piping 40, a valve such as the mixing valve 100, and the sublimable substance-containing liquid nozzle 39. The sublimable substance-containing liquid may be mixed with the diluting liquid at the upper surface of the substrate W.

Similarly, in the second preferred embodiment, the liquid containing the sublimable substance and supplied from at least one of the first undiluted liquid tank 87A and the second undiluted liquid tank 876 may be mixed with the solvent supplied from at least one of the first diluting liquid tank 93A and the second diluting liquid tank 93B at a position other than the mixing valve 100. For example, the liquid containing the sublimable substance may be mixed with the solvent at an inside or insides of at least one of a valve other than the mixing valve 100, piping, and the sublimable substance-containing liquid nozzle 39. The liquid containing the sublimable substance may be mixed with the solvent at the upper surface of the substrate W. The solid of the sublimable substance may be dissolved in the solvent at the inside of the cabinet CC.

The solidified film SF may be removed at the processing unit 2 different from the wet-processing unit 2W. The processing unit 2 to remove the solidified film SF may be a portion of the substrate processing apparatus 1, or may be a portion of a substrate processing apparatus different from the substrate processing apparatus 1. That is, a single substrate processing system may include the substrate processing apparatus 1 including the wet-processing unit 2W and a substrate processing apparatus including a processing unit 2 to remove the solidified film SF, and the substrate W may be transferred from the substrate processing apparatus 1 to another substrate processing apparatus before the solidified film SF is removed.

When the rinse liquid such as pure water on the substrate W can be replaced with the sublimable substance-containing liquid, the sublimable substance-containing liquid supplying step may be performed without performing the replacing liquid supplying step to replace the rinse liquid on the substrate W with the replacing liquid.

The shielding member 51 may rotate around the rotation axis A1 together with the spin chuck 10. For example, the shielding member 51 may be placed on the spin base 12 so as not to contact the substrate W. In the case, since the shielding member 51 is coupled to the spin base 12, the shielding member 51 rotates at the same speed in the same direction as that of the spin base 12.

The shielding member 51 may be eliminated. However, when a liquid such as pure water is supplied to the lower surface of the substrate W, the shielding member 51 is preferably provided. This is because the shielding member 51 can interrupt droplets flowing from the lower surface of the substrate W to the upper surface of the substrate W through the outer circumferential surface of the substrate W, or droplets that have bounced inwardly from the processing cup 21, thus reducing a liquid that would be otherwise mixed into the sublimable substance-containing liquid on the substrate W.

The substrate processing apparatus 1 is not restricted to an apparatus for processing a disc-shaped substrate W, and may be an apparatus for processing a polygonal substrate W.

Two or more of all the arrangements described above may be combined. Two or more of all the steps described above may be combined.

The controller 3 is an example of the sublimable substance selecting unit and the solvent selecting unit. The sublimable substance-containing liquid supplying unit 99 is an example of the sublimable substance-containing liquid supplying unit. The spin chuck 10 and the central nozzle 55 are an example of the solidified film forming unit. The spin chuck 10 and the central nozzle 55 are also an example of the sublimating unit. The sublimable substance-containing liquid piping 40 and the mixing valve 100 are an example of the dissolving unit.

The preferred embodiments of the present invention are described in detail above, however, these are just detailed examples used for clarifying the technical contents of the present invention, and the present invention should not be limitedly interpreted to these detailed examples, and the spirit and scope of the present invention should be limited only by the claims appended hereto.

REFERENCE SIGNS LIST

1: substrate processing apparatus
3: controller (sublimable substance selecting unit, solvent selecting unit)
10: spin chuck (solidified film forming unit, sublimating unit)
40: sublimable substance-containing liquid piping (dissolving unit)
55: central nozzle (solidified film forming unit, sublimating unit)
99: sublimable substance-containing liquid supplying unit (sublimable substance-containing liquid supplying unit)
100: mixing valve (dissolving unit)
P1: pattern
Ps: side surface of pattern
Px: upper end portion of side surface of pattern
SF: solidified film
W: substrate

What is claimed is:

1. A manufacturing method for a sublimable substance-containing liquid to be removed from a substrate when drying a front surface of the substrate on which a pattern is formed, the manufacturing method for the sublimable substance-containing liquid comprising:
    a sublimable substance selecting step of selecting a sublimable substance based on whether a surface of the pattern is hydrophilic or hydrophobic;
    a solvent selecting step of selecting a solvent for hydrophilicity having less solubility in water than that of the sublimable substance selected in the sublimable substance selecting step in a case in which the surface of the pattern is hydrophilic and selecting a solvent for hydrophobicity having less solubility in oil than that of the sublimable substance selected in the sublimable substance selecting step in a case in which the surface of the pattern is hydrophobic; and
    a dissolving step of dissolving the sublimable substance selected in the sublimable substance selecting step in the solvent selected in the solvent selecting step.

2. The manufacturing method for the sublimable substance-containing liquid according to claim 1, further comprising a property determining step of regarding the surface of the pattern as hydrophilic before selecting the sublimable substance and the solvent when a hydrophilic portion and a hydrophobic portion are included in the surface of the pattern and an upper end portion of a side surface of the pattern is hydrophilic and regarding the surface of the pattern as hydrophobic before selecting the sublimable substance and the solvent when the hydrophilic portion and the hydrophobic portion are included in the surface of the pattern and the upper end portion of the side surface of the pattern is hydrophobic.

3. A substrate processing apparatus to dry a front surface of a substrate on which a pattern is formed, the substrate processing apparatus comprising:
    a sublimable substance selecting unit that selects a sublimable substance based on whether a surface of the pattern is hydrophilic or hydrophobic;
    a solvent selecting unit that selects a solvent for hydrophilicity having less solubility in water than that of the sublimable substance selected by the sublimable substance selecting unit in a case in which the surface of the pattern is hydrophilic and selects a solvent for hydrophobicity having less solubility in oil than that of the sublimable substance selected by the sublimable substance selecting unit in a case in which the surface of the pattern is hydrophobic;

a dissolving unit that manufactures a sublimable substance-containing liquid containing the sublimable substance and the solvent by dissolving the sublimable substance selected by the sublimable substance selecting unit in the solvent selected by the solvent selecting unit;

a sublimable substance-containing liquid supplying unit that supplies the sublimable substance-containing liquid manufactured by the dissolving unit to the front surface of the substrate;

a solidified film forming unit that forms a solidified film including the sublimable substance onto the front surface of the substrate by evaporating the solvent from the sublimable substance-containing liquid on the front surface of the substrate; and a sublimating unit that removes the solidified film from the front surface of the substrate by sublimating the solidified film.

4. A substrate drying method comprising:

a sublimable substance-containing liquid supplying step of supplying a front surface of a substrate with a sublimable substance-containing liquid manufactured by the manufacturing method for the sublimable substance-containing liquid according to claim 1;

a solidified film forming step of forming a solidified film including the sublimable substance onto the front surface of the substrate by evaporating the solvent from the sublimable substance-containing liquid on the front surface of the substrate; and a sublimating step of removing the solidified film from the front surface of the substrate by sublimating the solidified film.

5. A substrate drying method comprising:

a sublimable substance-containing liquid supplying step of supplying a front surface of a substrate with a sublimable substance-containing liquid manufactured by the manufacturing method for the sublimable substance-containing liquid according to claim 2;

a solidified film forming step of forming a solidified film including the sublimable substance onto the front surface of the substrate by evaporating the solvent from the sublimable substance-containing liquid on the front surface of the substrate; and a sublimating step of removing the solidified film from the front surface of the substrate by sublimating the solidified film.

* * * * *